United States Patent
Han

(10) Patent No.: US 11,114,504 B1
(45) Date of Patent: Sep. 7, 2021

(54) SEMICONDUCTOR DEVICE INCLUDING VARIABLE RESISTANCE LAYER

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/011,396

(22) Filed: Sep. 3, 2020

(30) Foreign Application Priority Data

Apr. 14, 2020 (KR) ........................ 10-2020-0045589

(51) Int. Cl.
*G11C 13/00* (2006.01)
*H01L 27/24* (2006.01)
*H01L 45/00* (2006.01)

(52) U.S. Cl.
CPC .......... *H01L 27/249* (2013.01); *G11C 13/004* (2013.01); *G11C 13/0007* (2013.01); *G11C 13/0069* (2013.01); *G11C 13/0097* (2013.01); *H01L 27/2454* (2013.01); *H01L 45/08* (2013.01); *G11C 2013/0071* (2013.01); *G11C 2213/71* (2013.01); *G11C 2213/75* (2013.01)

(58) Field of Classification Search
CPC ... H01L 27/249; H01L 45/08; H01L 27/2454; G11C 13/0097; G11C 13/0069; G11C 13/0007; G11C 13/004; G11C 2213/71; G11C 2013/0071; G11C 2213/75
USPC .................................................. 365/148, 158
See application file for complete search history.

(56) References Cited

U.S. PATENT DOCUMENTS

| | | | |
|---|---|---|---|
| 7,326,921 B2* | 2/2008 | Matsumoto | ....... H01L 31/02027 250/214 C |
| 9,899,304 B2 | 2/2018 | Imafuji et al. | |
| 10,210,930 B2* | 2/2019 | Nakayama | ......... G11C 13/0002 |
| 2004/0164359 A1* | 8/2004 | Iwata | .................... H01L 29/792 257/379 |
| 2005/0169038 A1* | 8/2005 | Inoue | ..................... G11C 7/062 365/148 |
| 2005/0276138 A1* | 12/2005 | Inoue | ................... G11C 11/5685 365/210.1 |
| 2011/0267893 A1* | 11/2011 | Kato | ....................... G11C 16/06 365/185.22 |
| 2012/0280224 A1* | 11/2012 | Doolittle | .................. C30B 29/30 257/43 |
| 2013/0044535 A1* | 2/2013 | Shimakawa | ............. G11C 7/14 365/148 |
| 2013/0051125 A1* | 2/2013 | Chang | ................. G11C 13/0007 365/148 |
| 2014/0198557 A1* | 7/2014 | Tomita | ............... G11C 13/0007 365/148 |
| 2014/0244945 A1* | 8/2014 | Kim | .................... G11C 13/0069 711/147 |
| 2015/0255715 A1* | 9/2015 | Takagi | ................ H01L 27/2463 365/148 |

(Continued)

*Primary Examiner* — Michael T Tran

(57) ABSTRACT

A semiconductor device according to an embodiment includes a substrate, a gate structure disposed on the substrate, a hole pattern penetrating the gate structure on the substrate, and a first variable resistance layer, a second variable resistance layer, and a channel layer sequentially disposed on a sidewall surface of the gate structure. The gate structure includes at least one gate electrode layer and at least one interlayer insulation layer that are alternately stacked. The first and second variable resistance layers include ions exchangeable with each other.

20 Claims, 26 Drawing Sheets

(56) References Cited

U.S. PATENT DOCUMENTS

| | | | |
|---|---|---|---|
| 2015/0262626 A1* | 9/2015 | Hatsuda | G11C 11/1653 365/72 |
| 2015/0332760 A1* | 11/2015 | Kim | G06F 12/0875 711/125 |
| 2016/0049197 A1* | 2/2016 | Park | G11C 11/1653 365/148 |
| 2016/0070294 A1* | 3/2016 | Chung | H03K 5/24 345/213 |
| 2016/0072493 A1* | 3/2016 | Oh | H03K 5/2472 365/148 |
| 2016/0100484 A1 | 4/2016 | Kunieda et al. | |
| 2017/0010316 A1* | 1/2017 | Gerna | G01R 31/2621 |
| 2017/0133182 A1* | 5/2017 | Hsiao | G05F 3/262 |
| 2017/0170237 A1* | 6/2017 | Jung | H01L 27/2427 |
| 2017/0263336 A1* | 9/2017 | Nakayama | G11C 29/44 |
| 2017/0315573 A1* | 11/2017 | Bartalini | G05F 1/561 |
| 2018/0166630 A1* | 6/2018 | Tada | H01L 45/1253 |
| 2018/0175109 A1* | 6/2018 | Choi | G11C 13/0004 |
| 2019/0157553 A1* | 5/2019 | Trinh | H01L 45/1616 |
| 2020/0266344 A1* | 8/2020 | Wu | G11C 11/5685 |

\* cited by examiner

SEMICONDUCTOR DEVICE INCLUDING VARIABLE RESISTANCE LAYER

CROSS-REFERENCE TO RELATED APPLICATIONS

The present application claims priority under 35 U.S.C. § 119(a) to Korean Application No. 10-2020-0045589, filed on Apr. 14, 2020, which is incorporated herein by reference in its entirety.

BACKGROUND

1. Technical Field

The present disclosure generally relates to a semiconductor device and, more particularly, to a semiconductor device including a variable resistance layer.

2. Related Art

According to the trends of decreasing design rules and increasing degree of integration, memory devices with three-dimensional structures have appeared. Currently, a flash memory device has been produced employing a three-layer stacked structure of a charge tunneling layer, a charge trap layer, and a charge barrier layer as a charge storage structure.

Recently, various nonvolatile memory devices having structures different from traditional flash memory devices have been proposed. An example of a nonvolatile memory device is a resistance change memory device. While the flash memory device implements a memory function through charge storage, the resistance change memory device variably changes the resistance state of a memory layer in a memory cell between a high resistance state and a low resistance state, and stores the changed resistance states in a nonvolatile manner, thereby writing predetermined signal information in the memory cell.

SUMMARY

A semiconductor device according to an aspect of the present disclosure may include a substrate, a gate structure disposed on the substrate, a hole pattern penetrating the gate structure on the substrate, and a first variable resistance layer, a second variable resistance layer, and a channel layer that are sequentially disposed on a sidewall surface of the gate structure. The gate structure may include at least one gate electrode layer and at least one interlayer insulation layer that are alternately stacked. The first and second variable resistance layers may include ions exchangeable with each other.

A semiconductor device according to another aspect of the present disclosure may include a substrate, a gate structure disposed on the substrate, and a first variable resistance layer, a second variable resistance layer, and a channel layer that are sequentially disposed on a sidewall surface of the gate structure on the substrate. The gate structure may include at least one gate electrode layer and at least one interlayer insulation layer that are alternately stacked along a first direction perpendicular to the substrate. The gate structure extends in a second direction perpendicular to the first direction. The first and second variable resistance layers may include oxygen exchangeable with each other.

DETAILED DESCRIPTION

Figure 1:
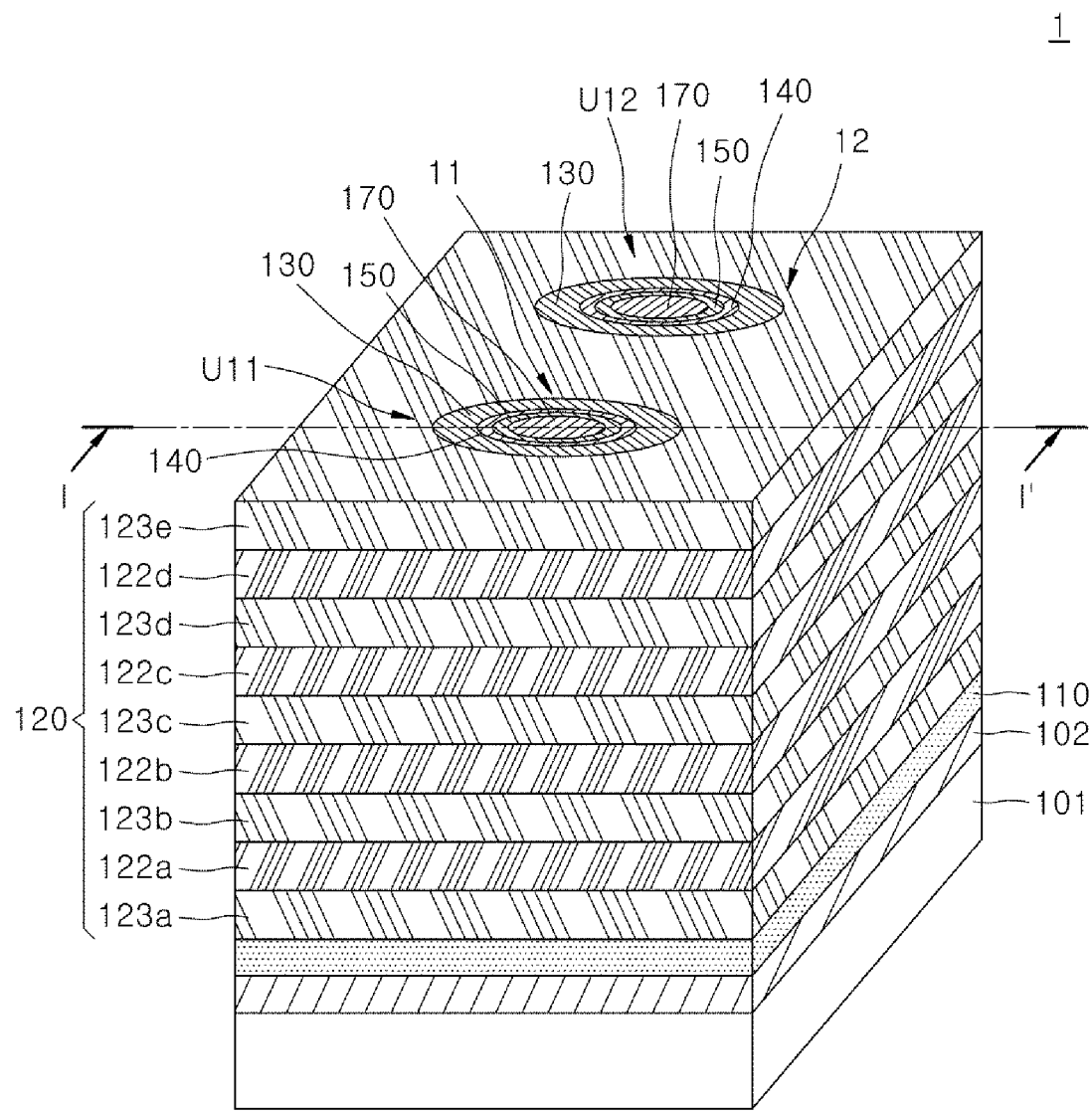
FIG. 1 is a perspective view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Figure 2:
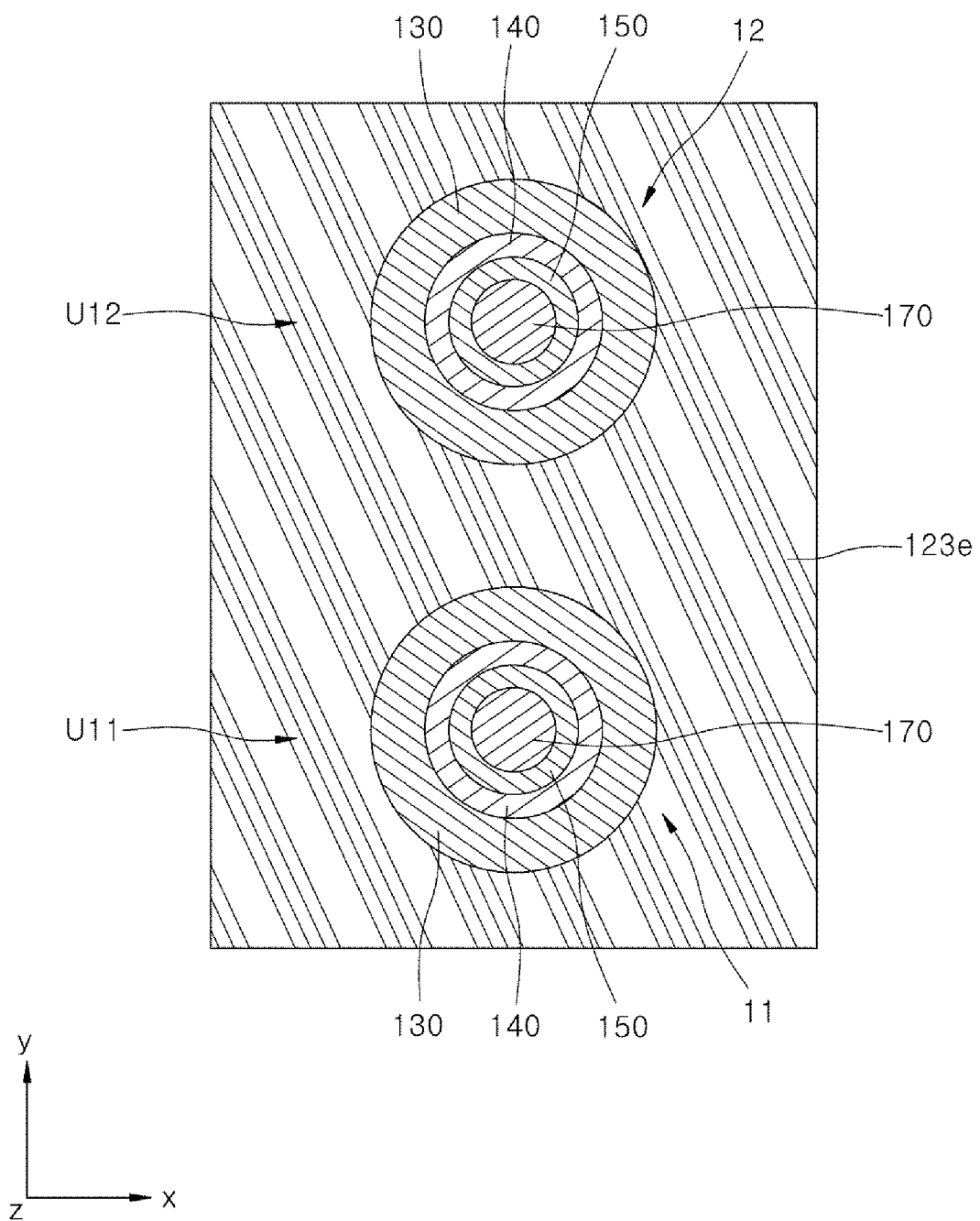
FIG. 2 is a plan view of the semiconductor device of FIG. 1.
Figure 3:
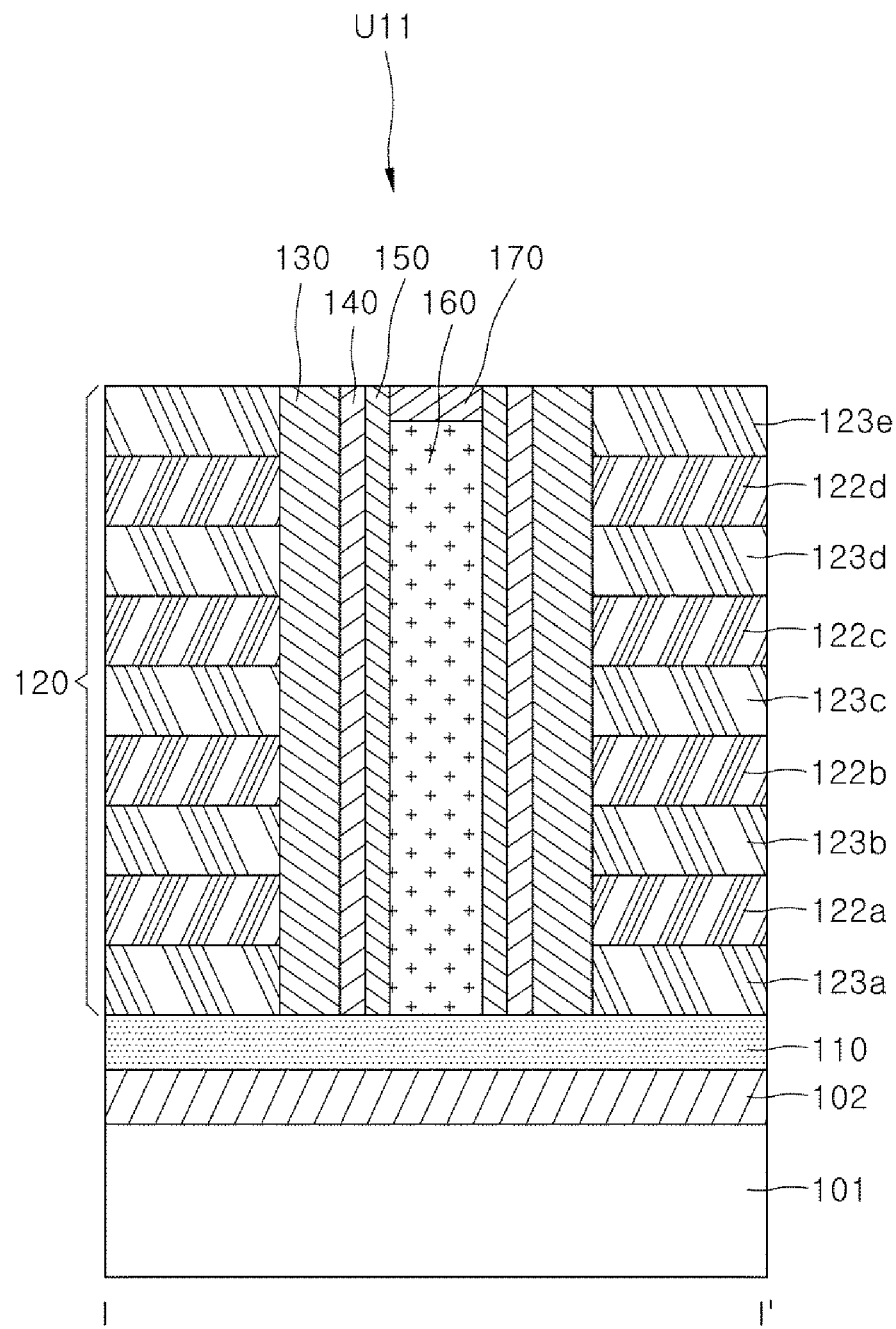
FIG. 3 is a cross-sectional view taken along a line I-I' of the semiconductor device of FIG. 1.

FIG. 1 is a perspective view schematically illustrating a semiconductor device 1 according to an embodiment of the present disclosure. FIG. 2 is a plan view of the semiconductor device of FIG. 1. FIG. 3 is a cross-sectional view taken along a line I-I' of the semiconductor device of FIG. 1.

Referring to FIGS. 1 to 3, the semiconductor device 1 may include a substrate 101 and a gate structure 120 disposed on the substrate 101. In addition, the semiconductor device 1 may include first and second hole patterns 11 and 12 penetrating the gate structure 120. The semiconductor device 1 may include a first variable resistance layer 130, a second variable resistance layer 140, and a channel layer 150, which are sequentially disposed on a sidewall surface of the gate structure 120 inside each of the first and second hole patterns 11 and 12.

The semiconductor device 1 may further include a channel lower contact layer 110, on or over the substrate 101, that contacts one end of the channel layer 150. The channel lower contact layer 110 may be electrically connected to a source electrode (not shown). In addition, the semiconductor device 1 may include a channel upper contact layer 170 contacting the other end of the channel layer 150. The other end of the channel layer 150 may be positioned opposite to the one end of the channel layer 150 in a direction (i.e., a z-direction) perpendicular to an upper or lower surface of the substrate 101. The channel upper contact layer 170 may be electrically connected to a drain electrode (not shown). A source-drain voltage may be applied to the channel layer 150 through the channel lower contact layer 110 and the upper channel contact layer 170.

Referring to FIGS. 1 to 3, the substrate 101 may include a semiconductor material. Specifically, the semiconductor material may include silicon (Si), germanium (Ge), gallium arsenic (GaAs), molybdenum selenide (MoSe$_2$), hafnium selenide (HfSe$_2$), indium selenide (InSe), gallium selenide (GaSe), black phosphorus, indium-gallium-zinc oxide (IGZO), or a combination of two or more thereof. The semiconductor material may be doped with a dopant. The semiconductor material may, for example, be doped into n-type or p-type.

A base insulation layer 102 may be disposed on or over the substrate 101. The base insulation layer 102 may electrically insulate the channel lower contact layer 105 from the substrate 101. The base insulation layer 102 may include an insulating material. The insulating material may include, for example, oxide, nitride, oxynitride, or a combination of two or more thereof.

The channel lower contact layer 110 may be disposed on or over the base insulation layer 102. The channel lower contact layer 110 may be electrically connected to the channel layer 150. Although not illustrated, the channel lower contact layer 110 may be connected to a source electrode (not shown). In some embodiments, the source electrode may be disposed over the gate structure 120. The source electrode may be electrically connected to the channel lower contact layer 110 through a conductive via that is disposed to penetrate the gate structure 120 and contact the channel lower contact layer 110. Accordingly, the channel lower contact layer 110 can apply the voltage of the source electrode to the channel layer 150.

The channel lower contact layer 110 may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 120 may be disposed on the channel lower contact layer 110. The gate structure 120 may include first to fourth gate electrode layers 122a, 122b, 122c, and 122d, and first to fifth interlayer insulation layers 123a, 123b, 123c, 123d, and 123e, which are alternately stacked along a first direction (i.e., the z-direction). The first interlayer insulation layer 123a may be disposed to contact the channel lower contact layer 110. The fifth interlayer insulation layer 123e may be disposed as an uppermost layer of the gate structure 120.

Each of the first to fourth gate electrode layers 122a, 122b, 122c, and 122d may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Each of the first to fifth interlayer insulation layers 123a, 123b, 123c, 123d, and 123e may include an insulating material. The insulating material may include, for example, oxide, nitride, oxynitride, or a combination of two or more thereof.

In some embodiments, the number of the gate electrode layers of the gate structure 120 might not necessarily be limited to four. The gate electrode layers may be disposed in various numbers, and the interlayer insulation layers may also be disposed in various numbers to insulate the gate electrode layers from each other along the first direction (i.e., the z-direction).

Referring to FIGS. 1 to 3, the first and second hole patterns 11 and 12 may penetrate through the gate structure 120 in the first direction (the z-direction) to the channel lower contact layer 110. In an embodiment, the first and second hole patterns 11 and 12 may be spaced apart from each other in a second direction (the y-direction). The first and second hole patterns 11 and 12 may be formed, for example, by known lithography and etch processes. As described later, the semiconductor device 1 may include first and second memory operation units U11 and U12 that are separated from each other for the first and second hole patterns 11 and 12. FIGS. 1 and 2 illustrates two hole patterns, but the present disclosure is not limited thereto. The semiconductor device 1 may include various numbers of hole patterns.

Referring to FIGS. 1 to 3, inside each of the first and second hole patterns 11 and 12, the first variable resistance layer 130 may be disposed on the sidewall surface of the gate structure 120. The first variable resistance layer 130 may be disposed to cover the sidewall surface of the gate structure 120. The second variable resistance layer 140 may be disposed on the first variable resistance layer 130. The second variable resistance layer 140 may be disposed along the sidewall surface of the gate structure 120 inside each of the first and second hole patterns 11 and 12. As an example, first variable resistance layer 130 and the second variable resistance layer 140 may be disposed in adjacent concentric layers within the first and second hole patterns 11 and 12.

The first and second variable resistance layers 130 and 140 may include oxygen exchangeable with each other. When an external electric field is applied, the oxygen may move in the form of an oxygen ion between the first variable resistance layer 130 and the second variable resistance layer 140.

In an embodiment, each of the first and second variable resistance layers 130 and 140 may include an oxide that does not satisfy the stoichiometric ratio. That is, each of the first and second variable resistance layers 130 and 140 may include an oxygen-deficient oxide. As an example, the oxygen-deficient oxide may include silicon oxide or metal oxide. Here, the silicon oxide does not satisfy the stoichiometric ratio between silicon and oxygen, and the oxygen content may be insufficient. Accordingly, the silicon oxide may include oxygen vacancies of a predetermined concentration. Likewise, the metal oxide does not satisfy the stoichiometric ratio between metal and oxygen, and the content of oxygen may be insufficient. Accordingly, the metal oxide may include oxygen vacancies of a predetermined concentration. The metal oxide may be, for example, lithium oxide, titanium oxide, aluminum oxide, nickel oxide, copper oxide, manganese oxide, hafnium oxide, zirconium oxide, tungsten oxide, niobium oxide, vanadium oxide, or the like.

As described above, each of the first and second variable resistance layers 130 and 140 may include oxygen vacancies. The oxygen vacancy has a positive charge and can function as an electron capture site. Accordingly, the oxygen vacancy can function as a moveable conductive carrier when subjected to an external electric field. The electrical resistances of the first and second variable resistance layers 130 and 140 may vary according to the concentrations of oxygen vacancies distributed inside the first and second variable resistance layers 130 and 140, respectively. As an example, the electrical resistances of the first and second variable resistance layers 130 and 140 may decrease as the concentrations of the oxygen vacancies increase, and may increase as the concentrations of the oxygen vacancies decrease.

In an embodiment, the second variable resistance layer 140 contacting the channel layer 150 may function as a memory layer of the semiconductor device 1. As described below, when an external electric field is applied, the second variable resistance layer 140 may exchange oxygen with the first variable resistance layer 130, thereby having oxygen vacancies in various concentrations depending on the magnitude of the applied electric field. As a result, the second variable resistance layer 140 may have a plurality of different electrical resistances, depending on the concentration of the oxygen vacancy. Then, after the external electric field is removed, the second variable resistance layer 140 may store, in a nonvolatile manner, the plurality of electrical resistances as a plurality of pieces of different signal information.

In an embodiment, the oxygen affinity of an element of the first variable resistance layer 130 may be greater than the oxygen affinity of an element of the second variable resistance layer 140. In the present disclosure, oxygen affinity may mean a bonding force between an element and oxygen in an oxide when a predetermined element is combined with oxygen to form a predetermined oxide. As an example, when the first variable resistance layer 130 or the second variable resistance layer 140 includes silicon oxide, the oxygen affinity of silicon (Si) constituting the silicon oxide may mean a bonding force between the silicon (Si) and oxygen in the silicon oxide. As another example, when the first variable resistance layer 130 or the second variable resistance layer 140 includes a predetermined metal oxide, the oxygen affinity of the metal constituting the metal oxide may mean a bonding force between the metal and oxygen in the metal oxide. That is, an element having a high oxygen affinity may have a relatively high probability of forming an oxide by combining with oxygen compared with an element having a low oxygen affinity. In addition, compared with an oxide containing an element having a relatively low oxygen affinity, an oxide containing an element having a relatively high oxygen affinity may have a relatively low probability of breaking bonds in the oxide to free ionized oxygen.

As an example, the first variable resistance layer 130 may include silicon oxide, and the second variable resistance layer 140 may include hafnium oxide or zirconium oxide. The first variable resistance layer 130 may contain less oxygen, whether present in an uncoupled state or incompletely coupled state, than the second variable resistance layer 140 because the oxygen affinity of silicon constituting the first variable resistance layer 130 is greater than that of hafnium or zirconium constituting the second variable resistance layer 140. Furthermore, oxygen existing in an uncoupled state or incompletely coupled state may have a high probability of being moved by an electric attraction or repulsive force generated by an applied external electric field.

Accordingly, as described later, when oxygen inside the first and second variable resistance layers 130 and 140 moves in the form of an oxygen ion under the influence of the external electric field, the amount of oxygen changed inside the second variable resistance layer 140 may be greater than the amount of oxygen changed inside the first variable resistance layer 130. Therefore, the concentration changes of oxygen vacancies inside the first and second variable resistance layers 130 and 140 occur based on the concentration changes of oxygen inside the first and second variable resistance layers 130 and 140. Accordingly, the electrical resistance of the second variable resistance layer 140, which is a memory layer, can be controlled relatively easier than the electrical resistance of the first variable resistance layer 130, because the concentration change of oxygen vacancies inside the second variable resistance layer 140 is greater than the concentration change of oxygen vacancies inside the first variable resistance layer 130.

In another embodiment, the first and second variable resistance layers 130 and 140 may include metal exchangeable with each other. As an example, when the first and second variable resistance layers 130 and 140 include a metal oxide including oxygen vacancies, the first and second variable resistance layers 130 and 140 may exchange metal in the metal oxide of any one of the first and second variable resistance layers 130 and 140 as well as oxygen. The metal may move in the form of a metal ion between the first variable resistance layer 130 and the second variable resistance layer 140 by application of an external electric field.

As an example, the first variable resistance layer 130 may include lithium oxide, and the second variable resistance layer 140 may include transition metal oxide. The transition metal oxide may include, for example, hafnium oxide or zirconium oxide. When an external electric field is applied, lithium (Li) having a relatively small atomic weight inside the first variable resistance layer 130 may move in the form of a lithium ion between the first variable resistance layer 130 and the second variable resistance layer 140. When the lithium (Li) is supplied to the second variable resistance layer 140 from the first variable resistance layer 130 by an external electric field, the lithium (Li) may be combined with oxygen to form oxygen vacancies inside the second variable resistance layer 140. That is, as the concentration of lithium (Li) moving from the first variable resistance layer 130 to the second variable resistance layer 140 increases, the concentration of oxygen vacancies inside the second variable resistance layer 140 may increase, and the electrical resistance of the second variable resistance layer 140 may decrease.

In an embodiment, because the second variable resistance layer 140 functions as a memory layer and the first variable resistance layer 130 functions to control the concentration of the oxygen vacancies of the second variable resistance layer 140, the thickness of the second variable resistance layer 140 may be less than the thickness of the first variable resistance layer 130. Accordingly, the concentration of the oxygen vacancies of the second variable resistance layer 140, which is a memory layer, can be more effectively controlled using the first variable resistance layer 130.

In an embodiment, the thickness of the second variable resistance layer 140 may be 1 nm or more, but less than 5 nm. As the thickness of the second variable resistance layer 140 decreases, the concentration of oxygen vacancies in the second variable resistance layer 140 may change more rapidly when an external electric field is applied. In addition, in an embodiment, the signal information stored in the second variable resistance layer 140 may be electrical resistance along the longitudinal direction (i.e., the z-direction) of the channel layer 150. The magnitude of the electrical resistance may be determined by the concentration of the oxygen vacancies distributed in the second variable resistance layer 140 along the longitudinal direction (i.e., the z-direction) of the channel layer 150. Accordingly, as the thickness of the second variable resistance layer 140 decreases, the probability that the oxygen vacancies inside the second variable resistance layer 140 are arranged along the longitudinal direction (i.e., the z-direction) rather than along the width direction (i.e., the x-direction or y-direction) may increase. Therefore, it is possible to adjust the electrical resistance more effectively according to the concentration of oxygen vacancies inside the second variable resistance layer 140.

Referring to FIGS. 1 to 3, the channel layer 150 may be disposed on the channel lower contact layer 110 inside of first and second hole patterns 11 and 12 to cover the second variable resistance layer 140. The channel layer 150 may include a semiconductor material. The semiconductor material may include, for example, silicon (Si), germanium (Ge), gallium arsenic (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide ($MoSe_2$), hafnium selenide ($HfSe_2$), indium selenide (InSe), gallium selenide (GaSe), and the like. The semiconductor material may include, for example, metal oxide such as indium-gallium-zinc oxide (IGZO).

Meanwhile, filling insulation layers 160 may be disposed inside the first and second hole patterns 11 and 12 in which the first and second variable resistance layers 130 and 140, and the channel layer 150 are disposed. The filling insulation layers 160 may include, for example, oxide, nitride, oxynitride, or a combination of two or more thereof. The filling insulation layers 160 may be disposed to cover the channel layer 150 inside the first and second hole patterns 11 and 12.

Inside each of the first and second hole patterns 11 and 12, a channel upper contact layer 170 may be disposed on the filling insulation layer 160. The channel upper contact layer 170 may contact a portion of the channel layer 150. The channel upper contact layer 170 may be electrically connected to a drain electrode (not shown). Although not illustrated in FIGS. 1 to 3, the drain electrode may be disposed in a form of a conductive pattern on the gate structure 120.

In some embodiments, unlike illustrated in FIGS. 1 to 3, the channel upper contact layers 170 may be disposed outside the first and second hole patterns 11 and 12. As an example, the channel upper contact layer 170 may be disposed on the channel layer 150 to be electrically connected to the channel layer 150 at an upper end. Here, the drain electrode may be disposed to contact the channel upper contact layer 170 on the side or top of the channel upper contact layer 170.

The channel upper contact layer 170 may include a conductive material. The conductive material may include, for example, a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, the semiconductor device 1 according to the embodiments of the disclosure may include the first and second hole patterns 11 and 12 penetrating the gate structure 120 on the channel lower contact layer 110. The first and second variable resistance layers 130 and 140, and the channel layer 150 may be disposed inside each of the first and second hole patterns 11 and 12. In addition, the channel upper contact layer 170 may be disposed to contact a portion of the channel layer 150 in an upper portion of each of the first and second hole patterns 11 and 12. Accordingly, the channel layer 150 may be electrically connected to the channel lower contact layer 110 and the channel upper contact layer 170.

Further, the gate structure 120 may include first to fourth gate electrode layers 122a, 122b, 122c, and 122d and first to fifth interlayer insulation layers 123a, 123b, 123c, 123d, and 123e. The first to fourth gate electrode layers 122a, 122b, 122c, and 122d and the first to fifth interlayer insulation layers 123a, 123b, 123c, 123d, and 123e may be alternately stacked on the channel lower contact layer 110 and disposed to surround the first and second variable resistance layers 130 and 140 and the channel layer 150 in each of the first and second hole patterns 11 and 12.

In some embodiments, the number of the hole patterns passing through the gate structure 120 is not necessarily limited to two. The hole patterns may be formed in a variety of different numbers, and first and second variable resistance layers, a channel layer, a filling insulation layer, and a channel upper contact layer may be respectively disposed inside each of the hole patterns.

Referring back to FIGS. 1 and 2, the semiconductor device 1 may include first and second memory element units U11 and U12 that perform independent operations for each of the first and second hole patterns 11 and 12, respectively. The first and second memory element units U11 and U12 may share the channel lower contact layer 110. In addition, each of the first and second memory element units U11 and U12 may include the channel upper contact layer 170.

Figure 4:
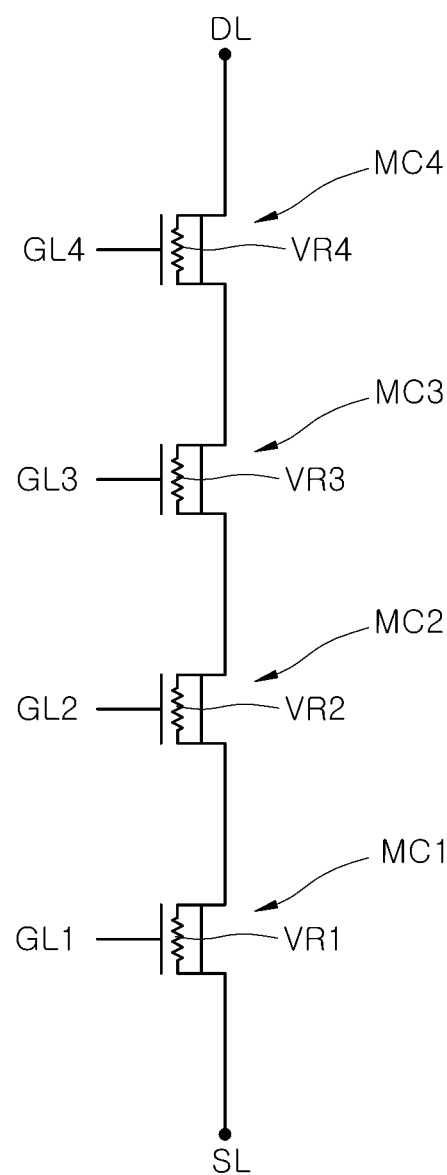
FIG. 4 is a circuit diagram of a semiconductor device according to an embodiment of the present disclosure.

FIG. 4 is a circuit diagram of a semiconductor device according to an embodiment of the present disclosure. The circuit diagram of FIG. 4 may correspond to one of the first and second memory element units U11 and U12 of the semiconductor device 1 described above with reference to FIGS. 1 to 3. That is, the circuit diagrams of the first and second memory elements U11 and U12 may be substantially the same. Hereinafter, as an example, a circuit configuration of the first memory element U11 will be described using the circuit diagram of the first memory element unit U11. Specifically, the circuit diagram of FIG. 4 may be composed of representations of the first and second variable resistance layers 130 and 140, the channel layer 150, and the first to fourth gate electrode layers 122a, 122b, 122c, and 122d, in the semiconductor device 1 of FIGS. 1 to 3. Referring to the circuit diagram of FIG. 4, the first memory element unit U11 may include first to fourth memory cells MC1, MC2, MC3, and MC4, each having a form of a transistor.

Referring to FIG. 4, the first to fourth memory cells MC1, MC2, MC3, and MC4 may be connected in series to each other in a string form between a source electrode SL and a drain electrode DL. Each of the first to fourth memory cells MC1, MC2, MC3, and MC4 may include a transistor-type nonvolatile memory element. The first to fourth memory cells MC1, MC2, MC3, and MC4 may include first to fourth variable resistances VR1, VR2, VR3, and VR4, respectively, disposed between the gate insulation layers and conductive channels of the transistors.

Referring back to FIGS. 1 to 3, the channel lower contact layer 110 and the channel upper contact layer 170 may be disposed at both ends of the channel layer 150, respectively, to contact the channel layer 150. Although not illustrated, the channel lower contact layer 110 and the channel upper contact layer 170 may be electrically connected to a source electrode and a drain electrode, respectively. Here, the source electrode and the drain electrode may correspond to the source electrode SL and the drain electrode DL of FIG. 4, respectively. The first to fourth gate electrode layers 122a, 122b, 122c, and 122d of FIGS. 1 to 3 may correspond to the first to fourth gate electrodes GL1, GL2, GL3, and GL4 of FIG. 4, respectively. In FIGS. 1 to 3, the regions of the first and second variable resistance layers 130 and 140 controlled by the first to fourth gate electrode layers 122a, 122b, 122c, and 122d may correspond to the first to fourth memory cells MC1, MC2, MC3, and MC4 including the variable resistances VR1, VR2, VR3, and VR4, respectively. Hereinafter, the operation of the memory element unit U11 illustrated in FIG. 4 will be described in detail using FIGS. 5A to 5H.

FIGS. 5A to 5H are views schematically illustrating operations of a semiconductor device according to embodiments of the present disclosure. Operation methods of the semiconductor device to be described with reference to FIGS. 5A to 5H will refer to the semiconductor device 1 described above with reference to FIGS. 1 to 3. In addition, for the convenience of explanation, the operations of the semiconductor device will be described, for example, using the configuration of the semiconductor device 1 that corresponds to the third memory cell MC3 having the third variable resistance VR3 illustrated in the circuit diagram of FIG. 4. The third memory cell MC3 including the third variable resistance VR3 may correspond to the portions of the first and second variable resistance layers 130 and 140 controlled by the third gate electrode layer 122c of FIGS. 5A to 5C, 5E to 5F, and 5H.

Figure 5A:
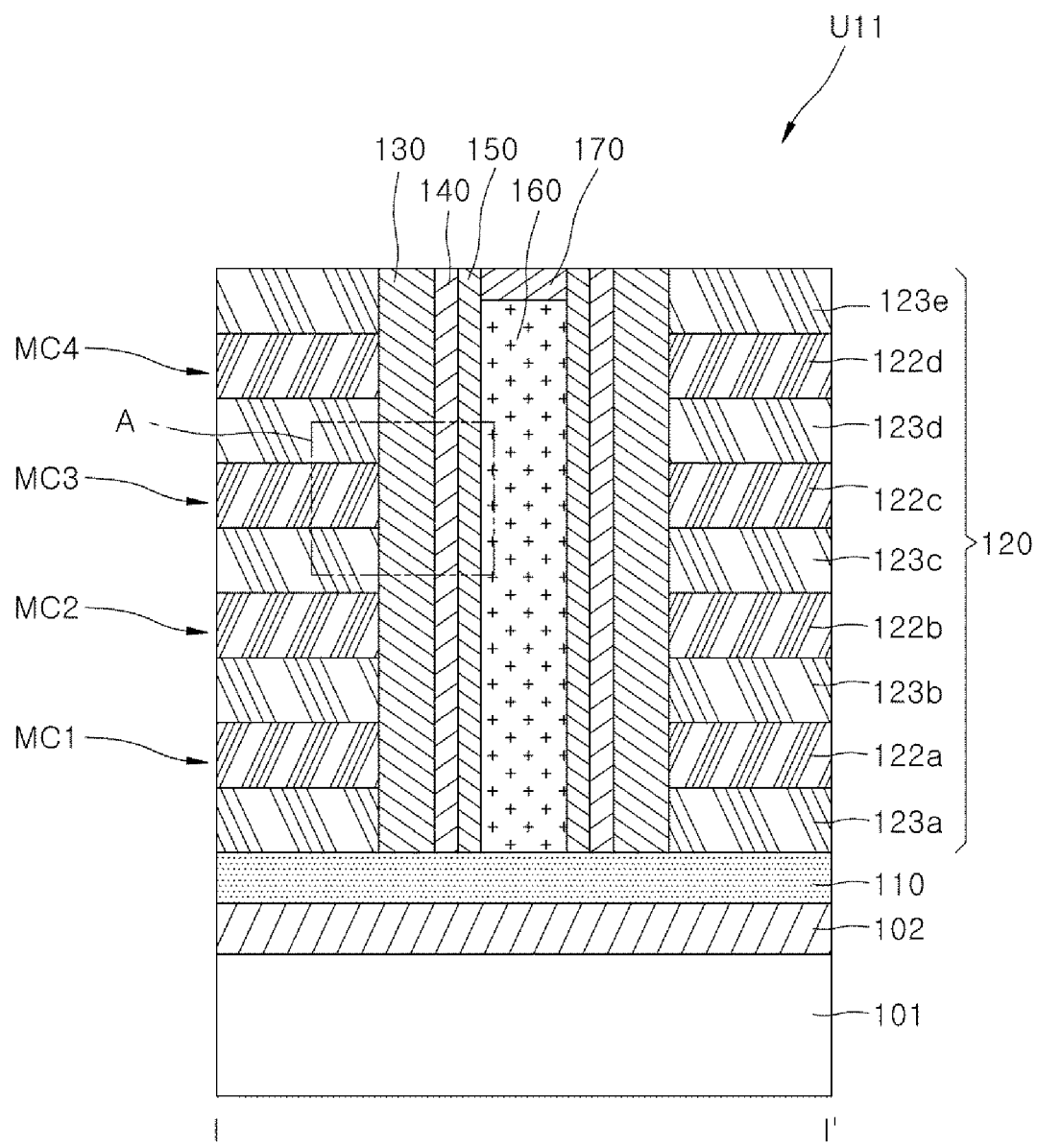
FIGS. 5A to 5H are views schematically illustrating operations of a semiconductor device according to embodiments of the present disclosure.
Figure 5B:
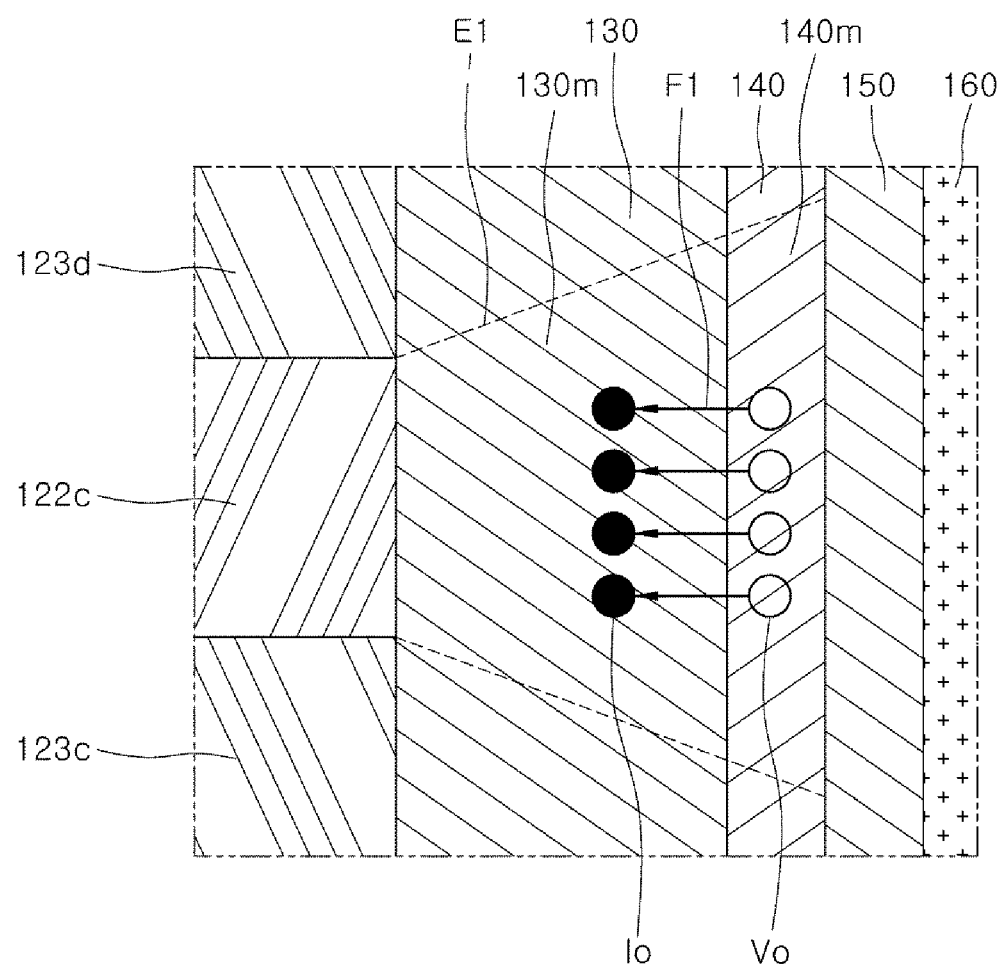
Figure 5C:
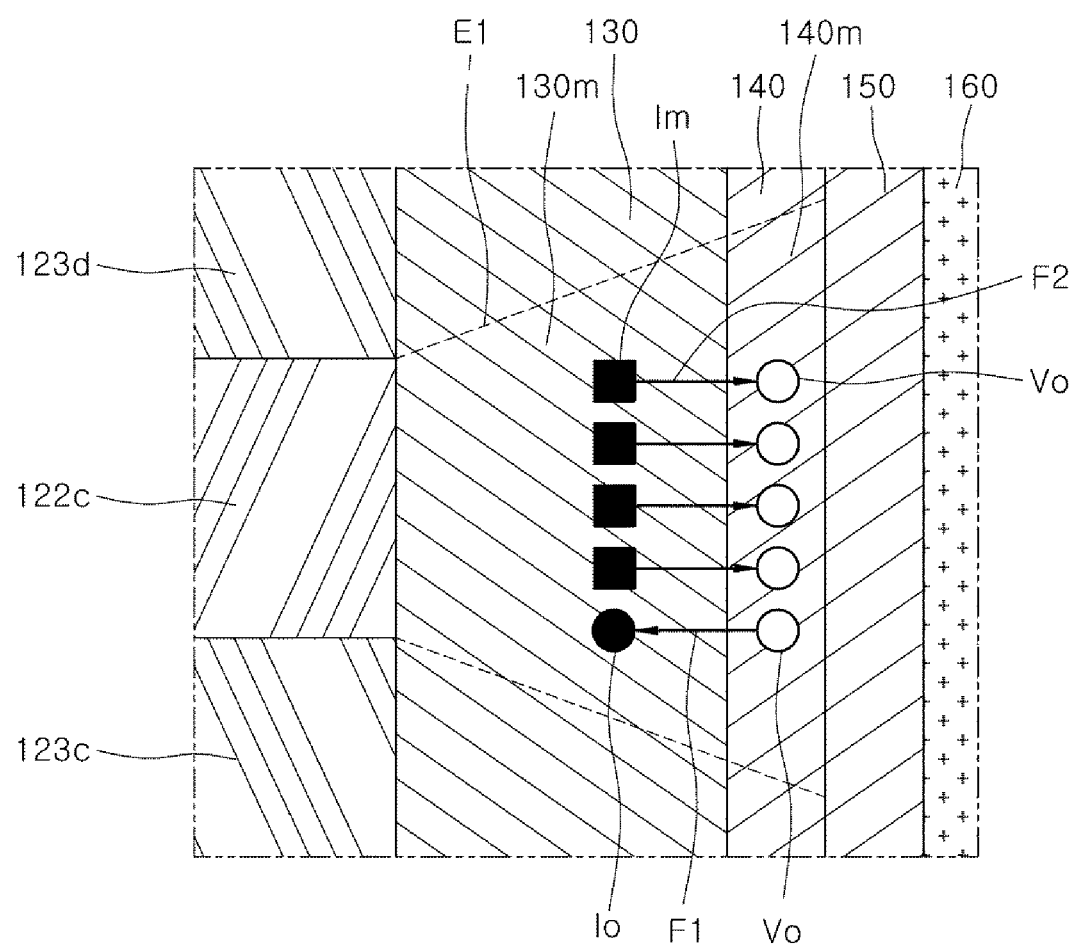
Figure 5D:
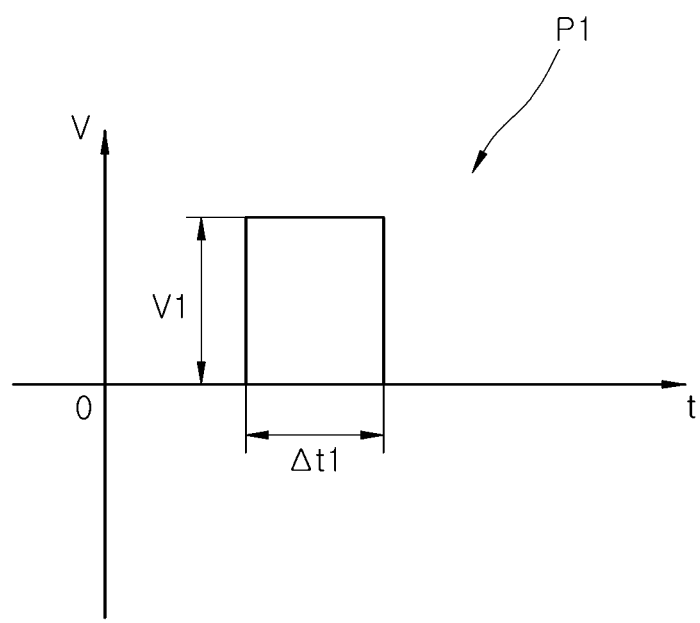
Figure 5E:
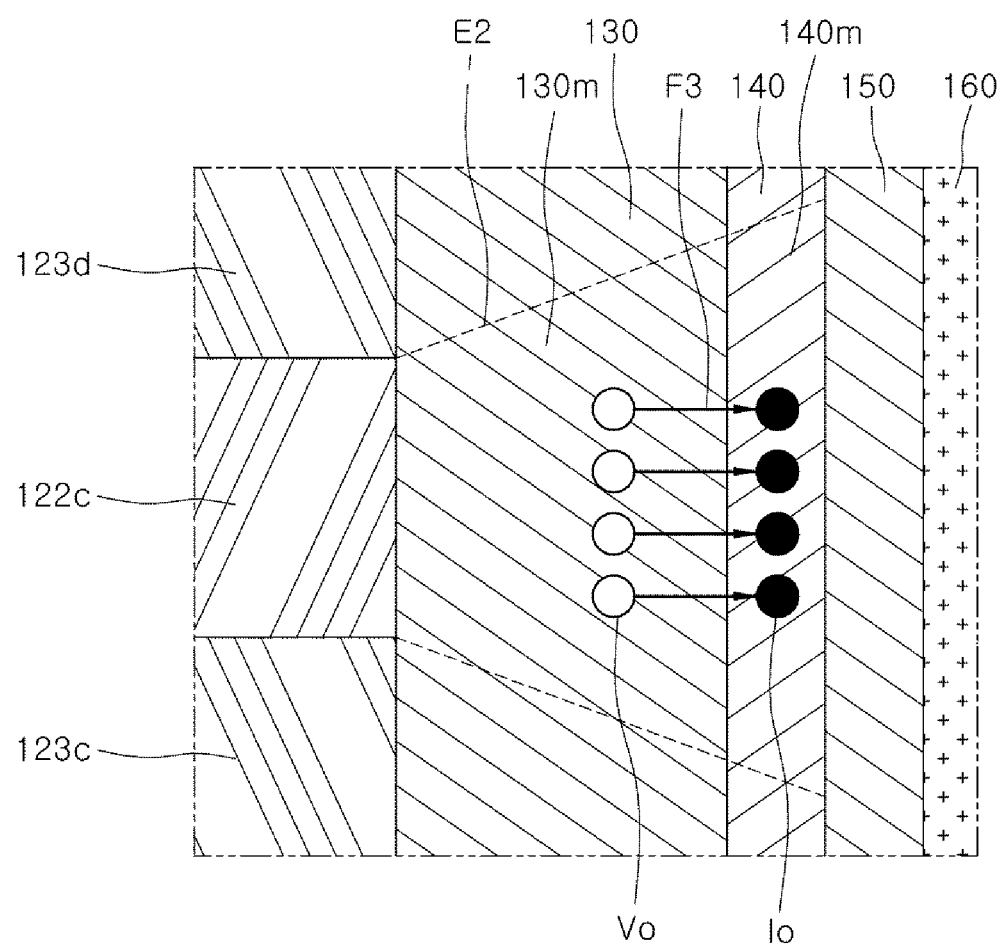
Figure 5F:
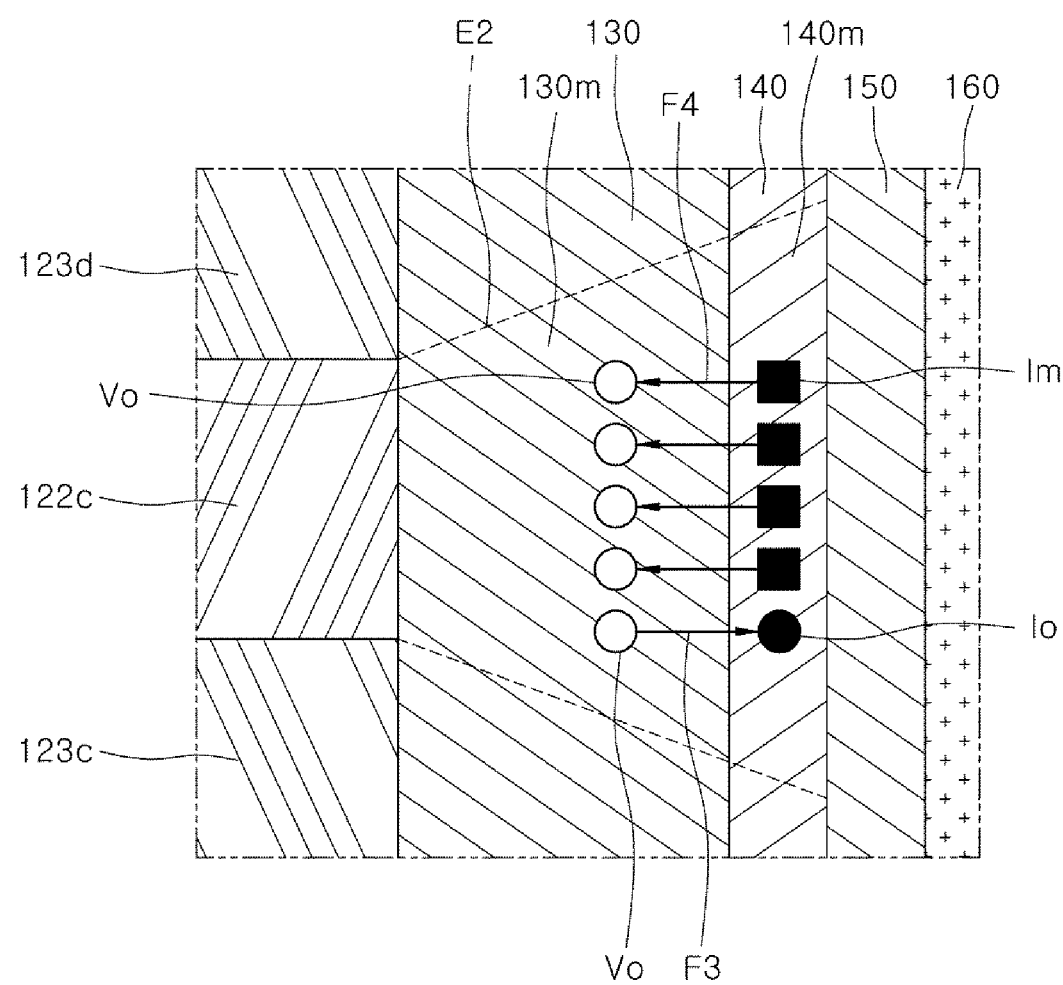
Figure 5G:
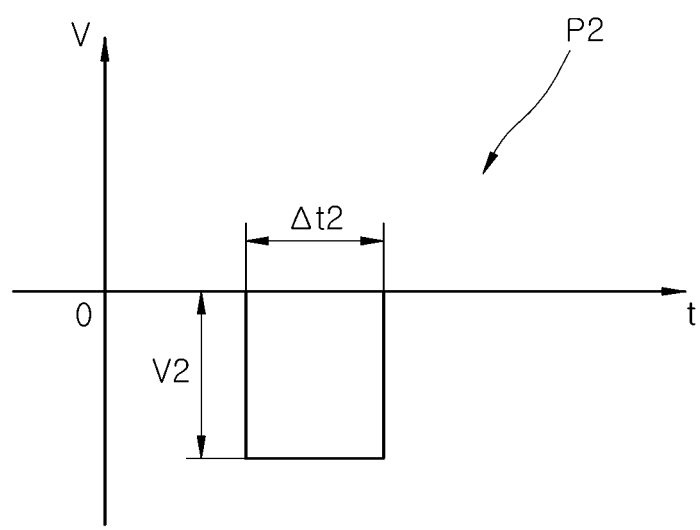
Figure 5H:
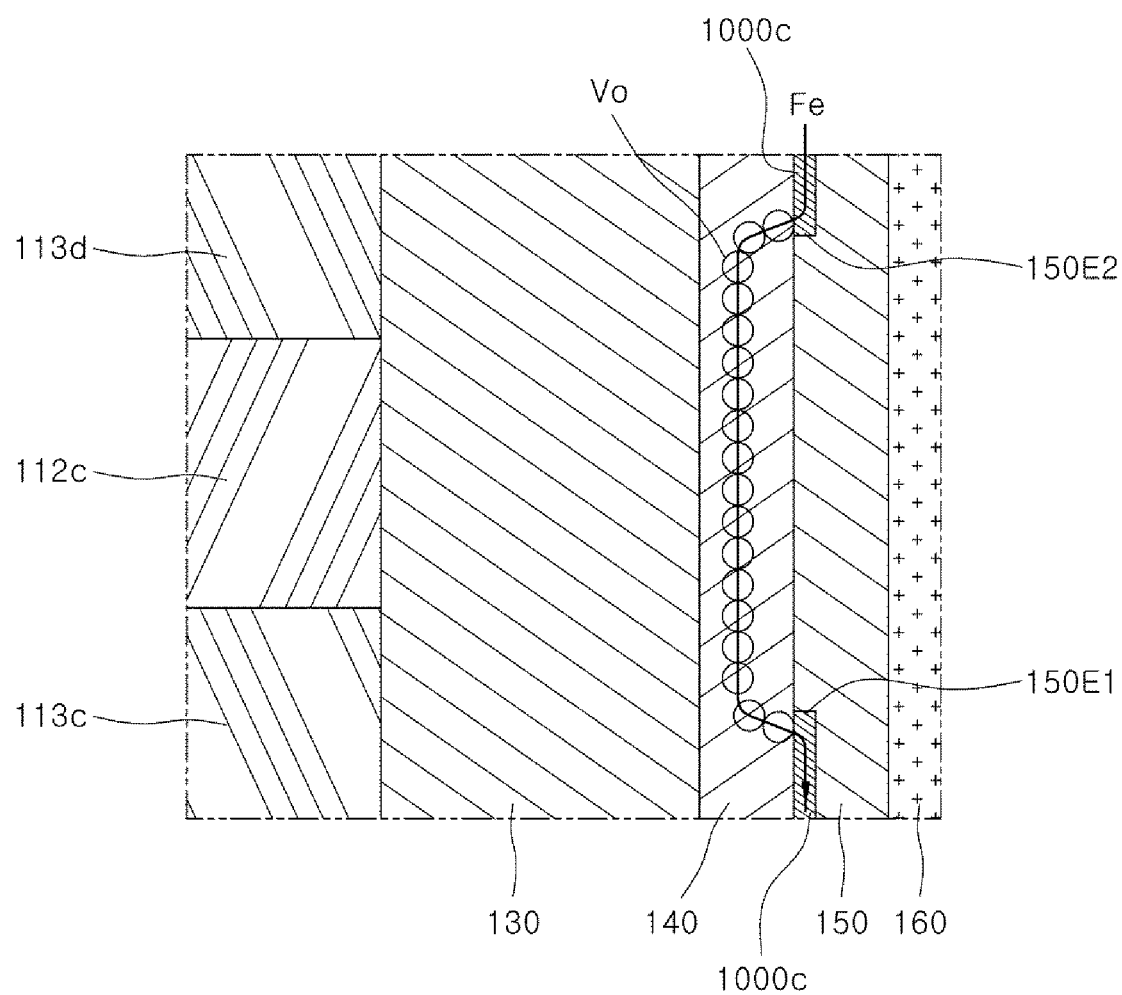

Specifically, FIG. 5A is a cross-sectional view of the semiconductor device 1 illustrated in FIG. 3. FIG. 5B is a view illustrating an example of a first write operation for the third memory cell MC3 in a region 'A' of FIG. 5A. FIG. 5C is a view illustrating another example of the first write operation for the third memory cell MC3 in the region 'A' of FIG. 5A. FIG. 5D is a view schematically illustrating the shape of a gate voltage for the first write operation. FIG. 5E is a view illustrating an example of a second write operation for the third memory cell MC3 in the region 'A' of FIG. 5A. FIG. 5F is a view illustrating another example of the second write operation for the third memory cell MC3 in the region 'A' of FIG. 5A. FIG. 5G is a view schematically illustrating the shape of a gate voltage for the second write operation. FIG. 5H is a view illustrating a read operation for the third memory cell MC3 in the region 'A' of FIG. 5A.

In an embodiment, each of the first and second variable resistance layers 130 and 140 may include oxygen vacancies. The oxygen vacancy concentrations of the first and second variable resistance layers 130 and 140 may vary depending on the amount of oxygen exchanged between the first and second variable resistance layers 130 and 140 when an external electric field is applied. Here, the second variable resistance layer 140, which is closer to the channel layer 150, may act as a memory layer that stores electrical resistance, corresponding to the concentration of the oxygen vacancies, as signal information.

As an example, a first write operation in which a low resistance state is written in the second variable resistance layer 140 will be described with reference to FIGS. 5A to 5D. The first write operation may be referred to as a program operation. As another example, a second write operation in which a high resistance state is written in the second variable resistance layer 140 will be described with reference to FIGS. 5A, and 5E to 5G. The second write operation may be referred to as an erase operation. As yet another example, a read operation for reading out an electrical resistance state written in the second variable resistance layer 140 of the third memory cell MC3 will be described with reference to FIGS. 5A and 5H.

Referring to FIGS. 5A and 5B, for the first write operation with respect to the third memory cell MC3, a predetermined first gate voltage including a bias of a positive polarity may be applied to the third gate electrode layer 122c. At this time, the channel layer 150 may be grounded. Referring to FIG. 5B, a first electric field E1 formed by the first gate voltage may act on a portion of each of the first and second variable resistance layers 130 and 140 of the third memory cell MC3. Specifically, the first electric field E1 may act on memory functional portions 130m and 140m of the first and second variable resistance layers 130 and 140.

Due to the first electric field E1, oxygen of the second variable resistance layer 140 may move to the first variable resistance layer 130 in the form of ions. In FIG. 5B, the movement of the oxygen ions Io is illustrated as "F1". Due to the outflow of oxygen ions Io, the concentration of oxygen in the second variable resistance layer 140 may decrease, and the concentration of oxygen vacancy Vo may increase. The oxygen vacancies Vo can function as a conductive carrier with a positive charge. As the concentration of oxygen vacancy Vo increases, the electrical resistance inside the second variable resistance layer 140 may decrease. The electrical resistance inside the second variable resistance layer 140 may be determined by the increased concentration of oxygen vacancy Vo. In some embodiments, the second variable resistance layer 140 may have multiple numbers of electrical resistances based on corresponding concentrations of the oxygen vacancies by changing the magnitude of the first gate voltage. Meanwhile, the oxygen ions Io that move to the first variable resistance layer 130 from the variable resistance layer 140 may be combined with silicon or metal in the oxide of the first variable resistance layer 130. Consequently, the concentration of oxygen vacancies in the first variable resistance layer 130 may decrease. Accordingly, the electrical resistance of the first variable resistance layer 130 may increase.

Subsequently, the first gate voltage may be removed from the third gate electrode layer 122c. After the first gate voltage is removed, the varied or changed concentration of the oxygen vacancies in the memory functional portions 130m and 140m of the first and second variable resistance layers 130 and 140, corresponding to third memory cell MC3 may be maintained. Accordingly, the memory functional portion 140m of the second variable resistance layer 140 of the third memory cell MC3 can store, in a nonvolatile manner, the electrical resistance decreased in response to the increased oxygen vacancy concentration. Similarly, the memory functional portion 130m of the first variable resistance layer 130 of the third memory cell MC3 can store in a nonvolatile manner the electrical resistance increased in response to the decreased concentration of oxygen vacancies.

As described above, in connection with the first write operation, which is a program operation, when the first gate voltage, which is the program voltage, is applied to the third gate electrode layer 122c belonging to the third memory cell MC3, the first variable resistance layer 130 may function as an oxygen receiving layer, and the second variable resistance layer 140 may function as an oxygen supply layer.

Meanwhile, FIGS. 5A and 5C illustrate another example of the first write operation for the third memory cell MC3. In this example, each of the first and second variable resistance layers 130 and 140 may include metal oxide including oxygen vacancies. In this case, the first metal constituting the metal oxide of the first variable resistance layer 130 and the second metal constituting the metal oxide of the second variable resistance layer 140 may have different atomic weights. Rather than the generation of oxygen vacancies following the movement of the oxygen ions Io described above with respect to FIG. 5B, oxygen vacancies are generated due to the movement of metal of the first metal and the second metal. As between the first and second variable resistance layers 130 and 140, the generation of oxygen vacancies may occur more predominantly in the second variable resistance layer 140.

Specifically, when an external electric field is formed between the third gate electrode layer 122c and the channel layer 150, at least some of the first metal and second metal may be converted into ionic states. At this time, metal having a smaller atomic weight as between the first metal and the second metal may move in the form of metal ion with relatively greater electrical mobility when the external electric field is applied. That is, when an external electric field is applied, an ion of the metal having a smaller atomic weight may be predominantly exchanged between the first and second variable resistance layers 130 and 140.

As an example, the first variable resistance layer 130 may include lithium-based oxide such as LiPON, $LiCoO_2$, $LiFePO_4$, $LiMn_2O_4$, and the second variable resistance layer 140 may include transition metal oxide such as $WO_3$, $MoO_3$, $SrTiO_3$, etc. A predetermined first gate voltage including a bias of a positive polarity may be applied to the third gate electrode layer 122c while the channel layer 150 is grounded. At this time, lithium (Li) inside the first variable resistance layer 130 may move to the second variable resistance layer 140 in the form of a positive lithium ion. In FIG. 5C, the movement of lithium (Li) ions when the first gate voltage is applied is illustrated as "F2". The lithium ions Inn that move to the second variable resistance layer 140 may be combined with the transition metal oxide in the second variable resistance layer 140 and generate oxygen vacancies Vo. As an example, when the second variable resistance layer 140 includes $WO_3$, the lithium (Li) may be combined with the $WO_3$ to form a $Li_xWO_{3-x}$ material, and so oxygen vacancies Vo may be formed inside the $Li_xWO_{3-x}$ material.

Meanwhile, as described above in connection with FIG. 5B, when the first gate voltage is applied, the movement F1 of oxygen ions Io from the second variable resistance layer 140 to the first variable resistance layer 130 may also occur. As the oxygen ions Io flow out, the concentration of the oxygen vacancies Vo in the second variable resistance layer 140 may increase.

In this embodiment, however, when the first gate voltage is applied, the electrical mobility of lithium (Li) ions Inn moving from the first variable resistance layer 130 to the second variable resistance layer 140 may be greater than the mobility of oxygen ions Io moving from the second variable resistance layer 140 to the variable resistance layer 130. Accordingly, the increase in the concentration of lithium (Li) ions Inn may be relatively greater than the decrease in the concentration of oxygen ions Io in the second variable resistance layer 140. As a result, a phenomenon occurs in which the concentration of oxygen vacancies in the second variable resistance layer 140 increases due to the first gate voltage, which causes the movement of lithium ions to dominate over the movement of oxygen ions.

Subsequently, the first gate voltage may be removed from the third gate electrode layer 122c. After the first gate voltage is removed, the memory functional portion 140m of the second variable resistance layer 140 of the third memory cell MC3 may store, in a nonvolatile manner, the electrical resistance decreased in response to the increase in concentration of oxygen vacancies. Similarly, the memory functional portion 130m of the first variable resistance layer 130 of the third memory cell MC3 may store, in a nonvolatile manner, the electrical resistance increased in response to the decrease in concentration of oxygen vacancies. The electrical resistance inside the second variable resistance layer 140 may be determined by the increased concentration of oxygen vacancy Vo. In some embodiments, the second variable resistance layer 140 may have multiple numbers of electrical resistances based on corresponding concentrations of the oxygen vacancies by changing the magnitude of the first gate voltage.

As described above, the first and second variable resistance layers 130 and 140 illustrated in FIG. 5C may include exchangeable metal in the form of ions. In connection with the first write operation, which is a program operation, when the first gate voltage, which is a program voltage, is applied to the third gate electrode layer 122c, the first variable resistance layer 130 may function as a metal ion supply layer, and the second variable resistance layer 140 may function as a metal ion receiving layer.

In an embodiment, as the first gate voltage of FIG. 5B or FIG. 5C, a pulse voltage P1 shown in FIG. 5D may be applied. The pulse voltage P1 may have a positive unit amplitude V1 for a unit time interval Δt1. The total magnitude of the first gate voltage may be determined according to the number of times the pulse voltage P1 is applied. That is, a predetermined electrical resistance decrease occurring in the second variable resistance layer 140 is derived through the application of the pulse voltage P1 once, and then the magnitude of the first gate voltage may be adjusted to the number of times the pulse voltage P1 is applied in consideration of the reduction in electrical resistance. As a result, different electrical resistances can be recorded in the second variable resistance layer 140 of a memory cell by controlling the magnitude of the first gate voltage applied to the memory cell using the pulse voltage P1. After the first gate voltage is removed, the recorded different electrical resistances may be stored, in a nonvolatile manner, in the second variable resistance layer 140 as different signal information. In other words, the second variable resistance layer 140 may have a plurality of different electrical resistances, based on the concentration of the oxygen vacancies that vary depending on the magnitude of the first gate voltage.

Meanwhile, an example of a second write operation for the third memory cell MC3 will be described with reference to FIGS. 5A and 5E. The second write operation may be, for example, an erase operation for the first and second variable resistance layers 130 and 140, on which the program operations illustrated in FIGS. 5A and 5B may also have been performed.

First, a predetermined second gate voltage including a bias of a negative polarity may be applied to the third gate electrode layer 122c. At this time, the channel layer 150 may be grounded. Referring to FIG. 5E, a second electric field E2 formed by the second gate voltage may act on portions of the first and second variable resistance layers 130 and 140. Specifically, the second electric field E2 may act on the memory functional portions 130m and 140m of the first and second variable resistance layers 130 and 140 that correspond to the third memory cell MC3.

By the second electric field E2, oxygen of the first variable resistance layer 130 may move to the second variable resistance layer 140 in the form of ions. In FIG. 5E, the movement of oxygen ions Io is represented as "F3". Depending on the introduction of oxygen ion Io, the concentration of oxygen in the second variable resistance layer 140 may increase, and the concentration of oxygen vacancy Vo may decrease. As the concentration of oxygen vacancy Vo decreases, the electrical resistance inside the second variable resistance layer 140 may be increased. Meanwhile, in the first variable resistance layer 130, the concentration of oxygen inside the first variable resistance layer 130 may decrease and the concentration of oxygen vacancy may increase as a result of the outflow of oxygen ions Io. Accordingly, the electrical resistance of the first variable resistance layer 130 may be decreased.

Subsequentially, the second gate voltage may be removed from the third gate electrode layer 122c. After the second gate voltage is removed, the changed concentration of oxygen vacancies in the functional portions 130m and 140m of the first and second variable resistance layers 130 and 140, corresponding to the third memory cell MC3, can be maintained. Accordingly, the memory functional portion 140m of the second variable resistance layer 140 may store, in a nonvolatile manner, the increased electrical resistance in response to the decreased concentration of oxygen vacancy. Similarly, the memory functional portion 130m of the first variable resistance layer 130 of the third memory cell MC3 may store, in a nonvolatile manner, the decreased electrical resistance in response to the increased concentration of oxygen vacancy.

As described above, in connection with the second write operation, which is an erase operation, when the second gate voltage, which is an erase voltage, is applied to the third gate electrode layer 122c corresponding to the third memory cell MC3, the first variable resistance layer 130 may function as an oxygen supply layer, and the second variable resistance layer 140 may function as an oxygen receiving layer.

Meanwhile, referring to FIGS. 5A and 5F, another example of the second write operation for the third memory cell MC3 will be described. This example of the second write operation may be an erase operation for the first and second variable resistance layers 130 and 140, on which program operations shown in FIGS. 5A and 5C may also have been performed. In this embodiment, as in the first write operation described above with reference to FIG. 5C, the variation in the concentration of the oxygen vacancy due to the movement of the lighter metal, as between the first metal and second metal, in the resistance change of the variable resistance layer 140 may have a greater effect than the variation in the concentration of oxygen vacancy according to the movement of oxygen ions Io between the first and second variable resistance layers 130 and 140.

A detailed explanation for the second write operation is as follows. First, a predetermined second gate voltage including a bias of a negative polarity may be applied to the third gate electrode layer 122c. At this time, lithium (Li) inside the second variable resistance layer 140 may move to the first variable resistance layer 130 in the form of positive ions. In FIG. 5F, the movement of lithium (Li) ions when the second gate voltage is applied is illustrated as "F4". As lithium (Li) ions Im flow out towards the first variable resistance layer 130, $Li_xWO_{3-x}$ inside the second variable resistance layer 140 may be converted to $WO_3$, and oxygen vacancies inside the second variable resistance layer 140 may be decreased.

In addition, when the second gate voltage is applied, oxygen ions Io may move from the first variable resistance layer 130 to the second variable resistance layer 140. As the oxygen ions Io flow in, the concentration of the oxygen vacancy Vo of the second variable resistance layer 140 may decrease.

In this embodiment, however, the electrical mobility of the lithium (Li) ions Im moving from the second variable resistance layer 140 to the first variable resistance layer 130 may be greater than the electrical mobility of the oxygen ions Io moving from the first variable resistance layer 130 to the second variable resistance layer 140. Accordingly, a decrease in the concentration of the lithium (Li) ions Im may be relatively greater than an increase in the concentration of oxygen ions Io in the second variable resistance layer 140. As a result, a phenomenon takes place in which the concentration of oxygen vacancies in the second variable resistance layer 140 decreases by the second gate voltage, which results in greater movement of lithium ions over oxygen ions.

Subsequently, the second gate voltage may be removed from the third gate electrode 122c. After the second gate voltage is removed, the memory functional portion 140m of the second variable resistance layer 140 of the third memory cell MC3 can store, in a nonvolatile manner, the electrical resistance increased in response to the decreased concentration of oxygen vacancy. Similarly, the memory functional portion 130m of the first variable resistance layer 130 of the third memory cell MC3 can store, in a nonvolatile manner, the electrical resistance decreased in response to the increased concentration of oxygen vacancy.

As described above, in connection with the second write operation illustrated in FIG. 5F, when the second gate voltage, which is an erase voltage, is applied to the third gate electrode layer 122c corresponding to the third memory cell MC3, the first variable resistance layer 130 may function as a metal receiving layer, and the second variable resistance layer 140 may function as a metal supply layer.

In an embodiment, as the second gate voltage of FIG. 5E or FIG. 5F, a pulse voltage P2 shown in FIG. 5G may be applied. The pulse voltage P2 may have a negative unit amplitude V2 for a unit time interval Δ t2. The total magnitude of the second gate voltage may be determined depending on the number of times the pulse voltage P2 is applied. That is, a predetermined electrical resistance decrease occurring in the second variable resistance layer 140 may be derived through the application of the pulse voltage P2 once, and then the magnitude of the second gate voltage may be adjusted to the number of times the pulse voltage P2 is applied, in consideration of the increase in electrical resistance. As a result, the magnitude of the second gate voltage applied to the memory cell may be controlled using the pulse voltage P2, thereby effectively controlling the magnitude of the electrical resistance inside the second variable resistance layer 140, which is a memory layer. After the second gate voltage is removed, the controlled electrical resistance can be stored, in a nonvolatile manner, in the second variable resistance layer 140.

Meanwhile, referring to FIGS. 5A and 5H, a read operation for the third memory cell MC3 will be described. First, a read voltage equal to or greater than a predetermined threshold voltage may be applied to the first gate electrode layer 122a, the second gate electrode layer 122b, and the fourth gate electrode layer 122d. However, the voltage might not be applied to the third gate electrode layer 122c. The absolute value of the read voltage may be less than the absolute values of the first and second write voltages, such that the resistance states stored in the first and second variable resistance layers 130 and 140 are not be changed by the application of the read voltage. As the read voltage is applied, a conductive channel 1000c may be formed in portions of the channel layer 150 controlled by the first gate electrode layer 122a, the second gate electrode layer 122b, and the fourth gate electrode layer 122d. That is, the conductive channel 1000c may be formed in portions of the channel layer 150 by the read voltage, other than the portion of the channel layer 150 that is electrically controlled by the third gate electrode layer 122c. Because the read voltage is not applied to the third gate electrode layer 122c, in the portion of the channel layer 150 that is electrically controlled by the third gate electrode layer 122c, the conductive channel 1000c may be disconnected. As a result, the conductive channel 1000c may be continuously formed between the channel lower contact layer 110 and the channel upper contact layer 170, except for the disconnected portion of the conductive channel 1000c that is electrically controlled by the third gate electrode layer 122c. In FIG. 5H, ends of the disconnected conductive channel 1000c are illustrated as a first disconnection portion 150E1 and a second disconnection portion 150E2.

Subsequently, a source-drain voltage may be applied between the channel lower contact layer 110 and the channel upper contact layer 170. Accordingly, a source-drain current may flow along the conductive channel 1000c. However, between the first disconnection portion 150E1 and the second disconnection portion 150E2 of the conductive channel 1000c, the source-drain current may flow through the second variable resistance layer 140, and not through the channel layer 150. That is, the internal resistance of the second variable resistance layer 140 may be configured to be smaller than the resistance of the channel layer 150 between the first disconnection portion 150E1 and the second disconnection portion 150E2. As an example, the maximum value of the internal resistance of the second variable resistance layer 140 may be smaller than the resistance between the first and second disconnection portions 150E1 and 150E2.

As a result, while the read voltage is applied to the first gate electrode layer 122a, the second gate electrode layer 122b, and the fourth gate electrode layer 122d, but not to the third gate electrode layer 122c, the resistance information stored in the memory functional portion 140m of the second variable resistance layer 140 corresponding to the third memory cell MC3 can be read by measuring the current flowing between the channel lower contact layer 110 and the channel upper contact layer 170 using the source-drain voltage. FIG. 5H represents the current flow as "Fe," and illustrates that the current flows through the oxygen vacancies Vo in the second variable resistance layer 140.

Figure 6:
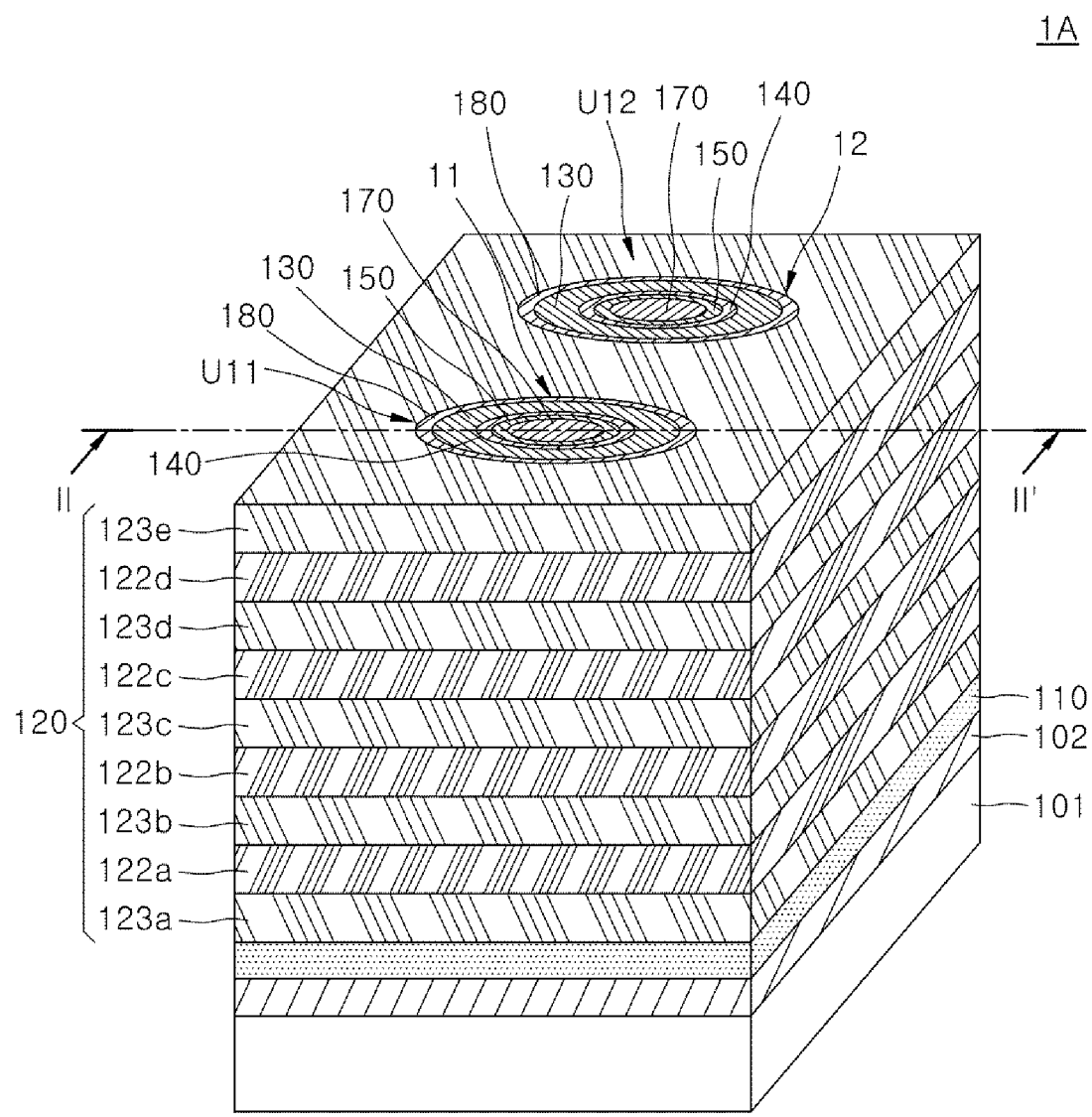
FIG. 6 is a perspective view schematically illustrating a semiconductor device according to another embodiment of the present disclosure.
Figure 7:
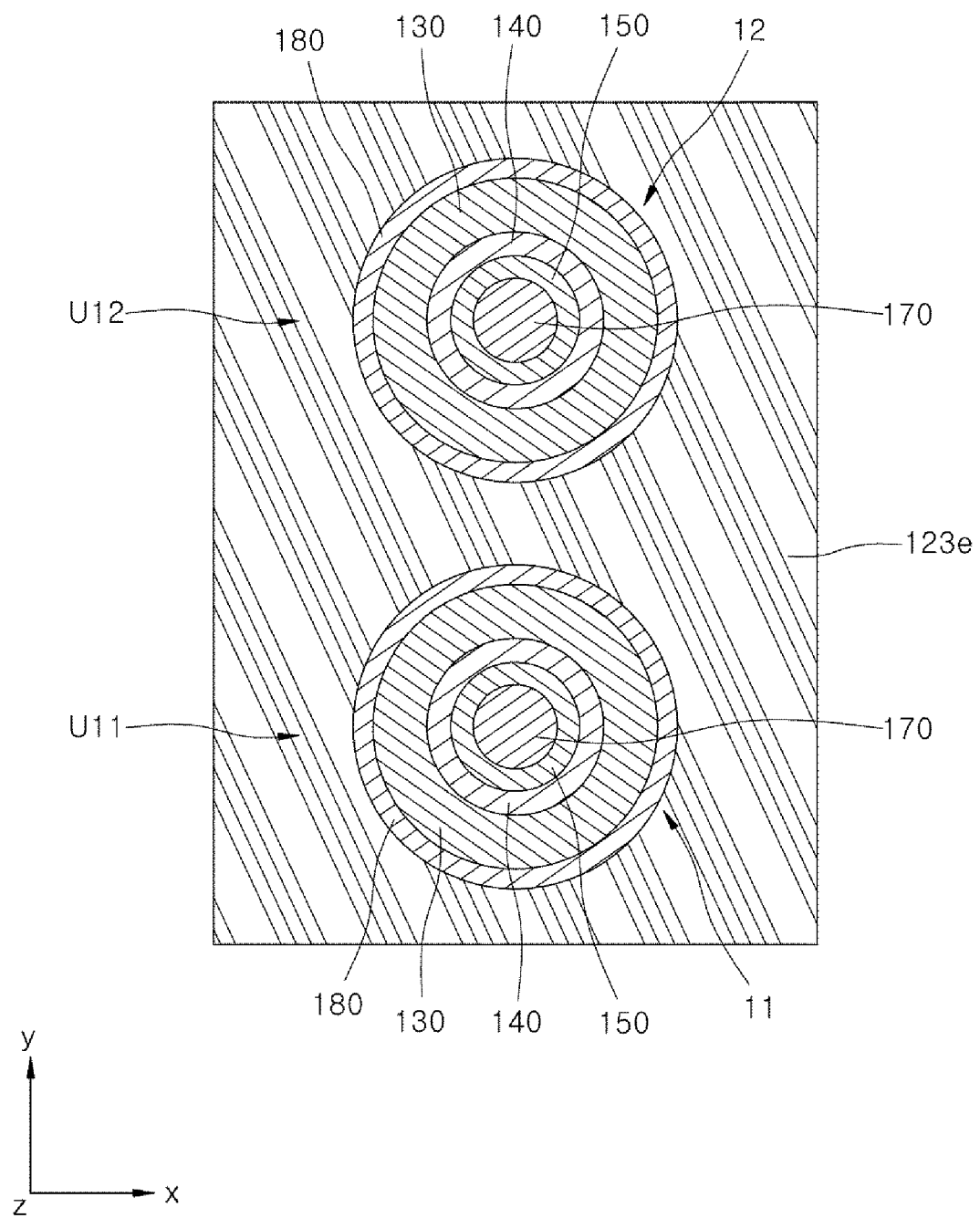
FIG. 7 is a plan view of the semiconductor device of FIG. 6.
Figure 8:
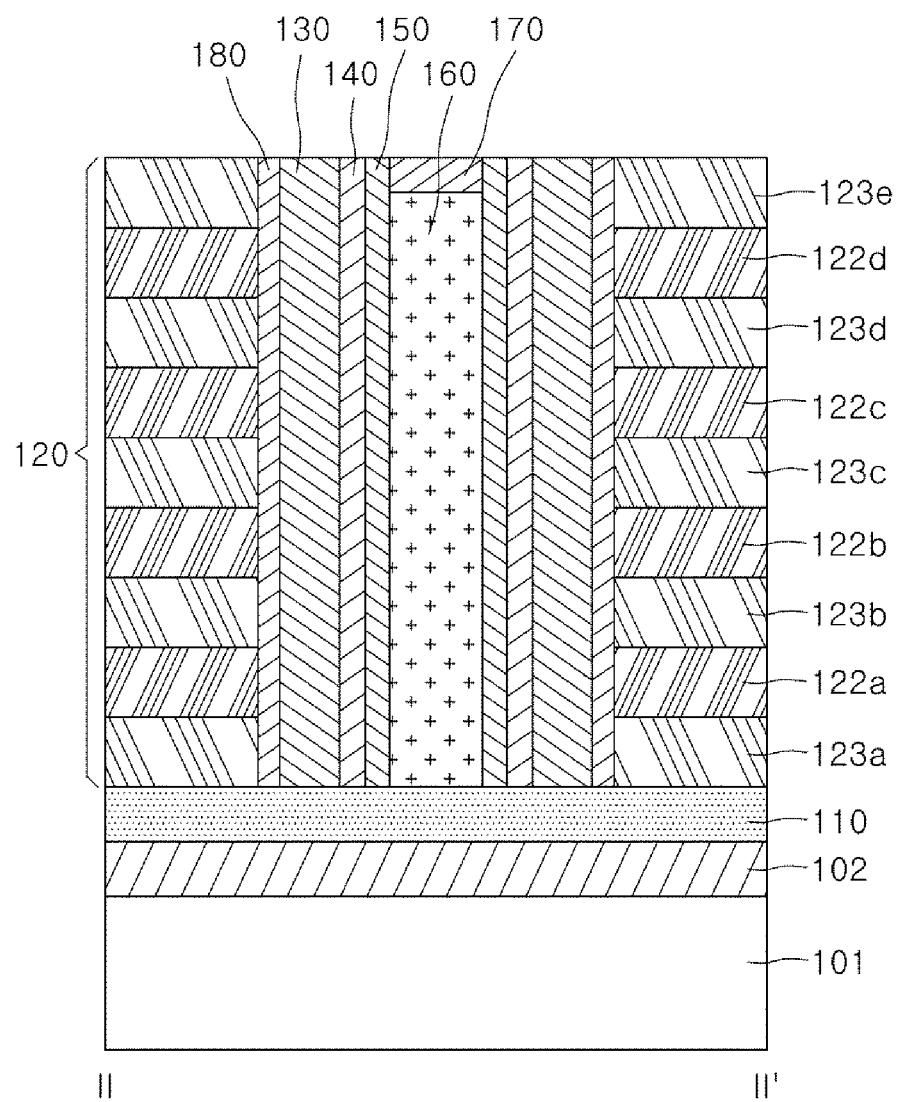
FIG. 8 is a cross-sectional view taken along a line II-II' of the semiconductor device of FIG. 6.

FIG. 6 is a perspective view schematically illustrating a semiconductor device 1A according to another embodiment of the present disclosure. FIG. 7 is a plan view of the semiconductor device of FIG. 6. FIG. 8 is a cross-sectional view taken along a line II-II' of the semiconductor device of FIG. 6. Referring to FIGS. 6 to 8, the semiconductor device 1A may further include a gate insulation layer 180, as compared with the semiconductor device 1 described above with reference to FIGS. 1 to 3. Other configurations of the semiconductor device 1A, except for the gate insulation layer 180, may be substantially the same as those of the semiconductor device 1 of FIGS. 1 to 3.

The gate insulation layer 180 may be disposed to cover a sidewall surface of a gate structure 120 inside first and second hole patterns 11 and 12. A first variable resistance layer 130, a second variable resistance layer 140, and a channel layer 150 may be sequentially disposed on the gate insulation layer 180.

The gate insulation layer 180 may serve as a barrier layer preventing material diffusion between first to fourth gate electrode layers 122a, 122b, 122c, and 122d and the first variable resistance layer 130. The gate insulation layer 180 may also serve to electrically insulate the first to fourth gate electrode layers 122a, 122b, 122c, and 122d from the first variable resistance layer 130. As a result, a leakage current flowing from the channel layer 150 to the first to fourth gate electrode layers 122a, 122b, 122c, and 122d through the first and second variable resistance layers 130 and 140 can be suppressed or minimized.

The gate insulation layer 180 may include an insulating material. The gate insulation layer 180 may include, for example, silicon oxide, silicon nitride, silicon oxynitride, aluminum oxide, hafnium oxide, or the like.

Figure 9:
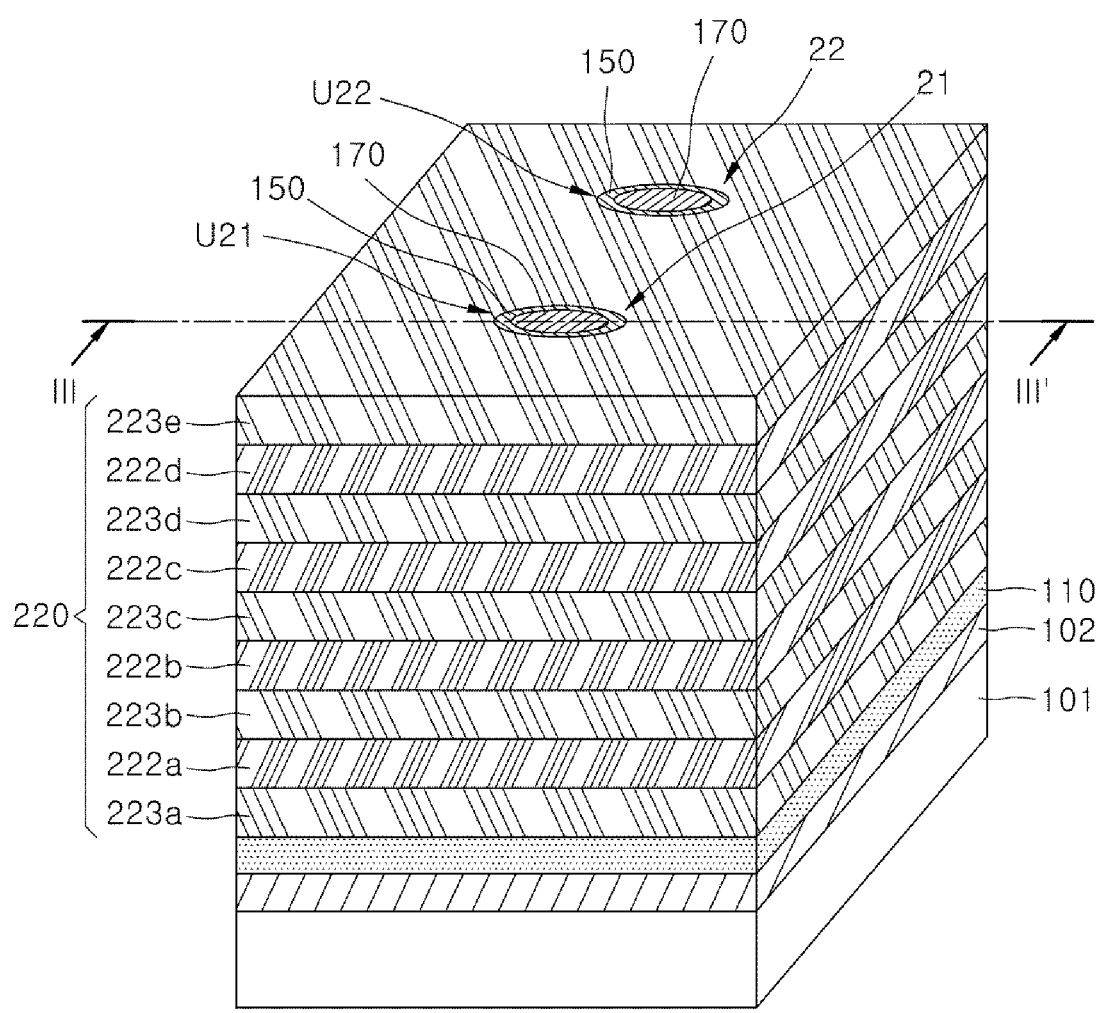
FIG. 9 is a perspective view schematically illustrating a semiconductor device according to yet another embodiment of the present disclosure.
Figure 10:
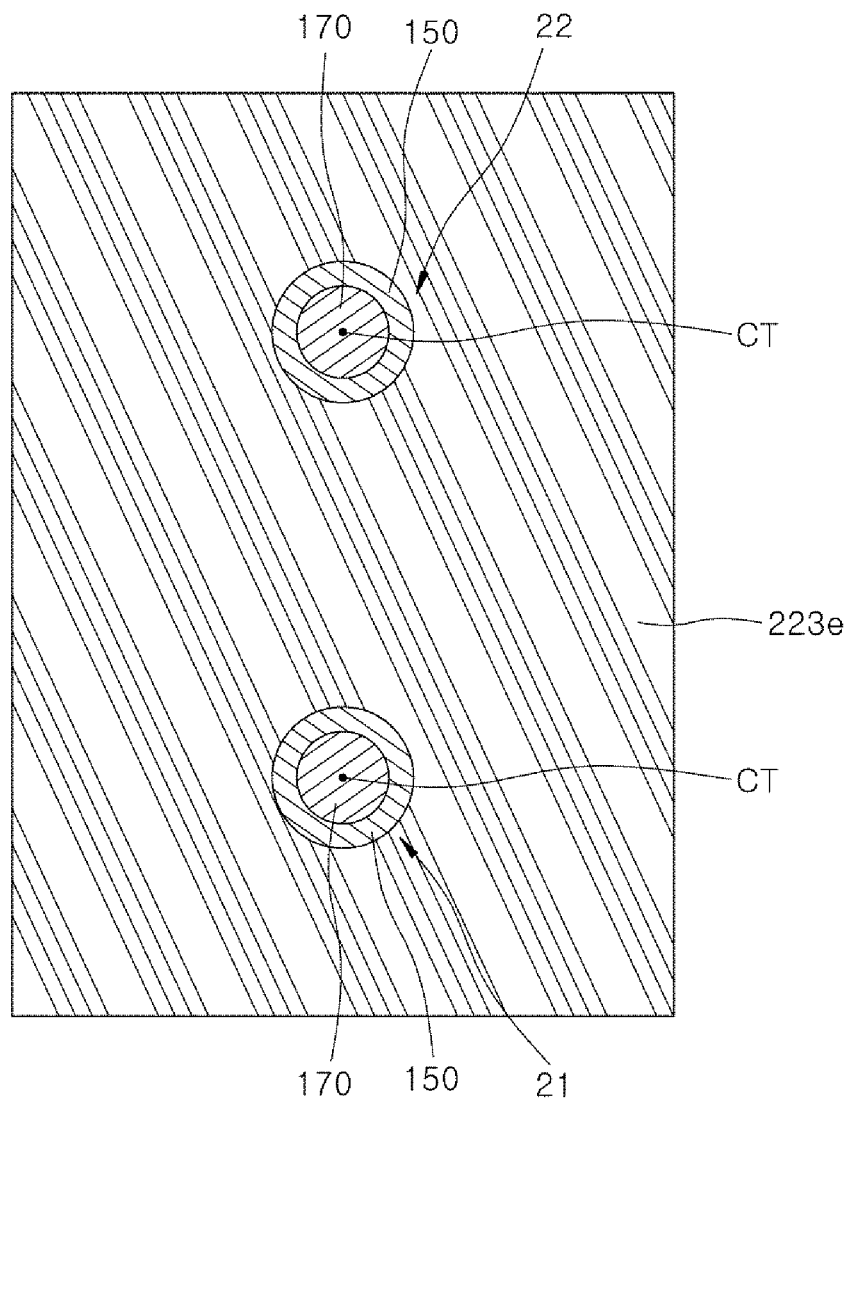
FIG. 10 is a plan view of the semiconductor device of FIG. 9.
Figure 11:
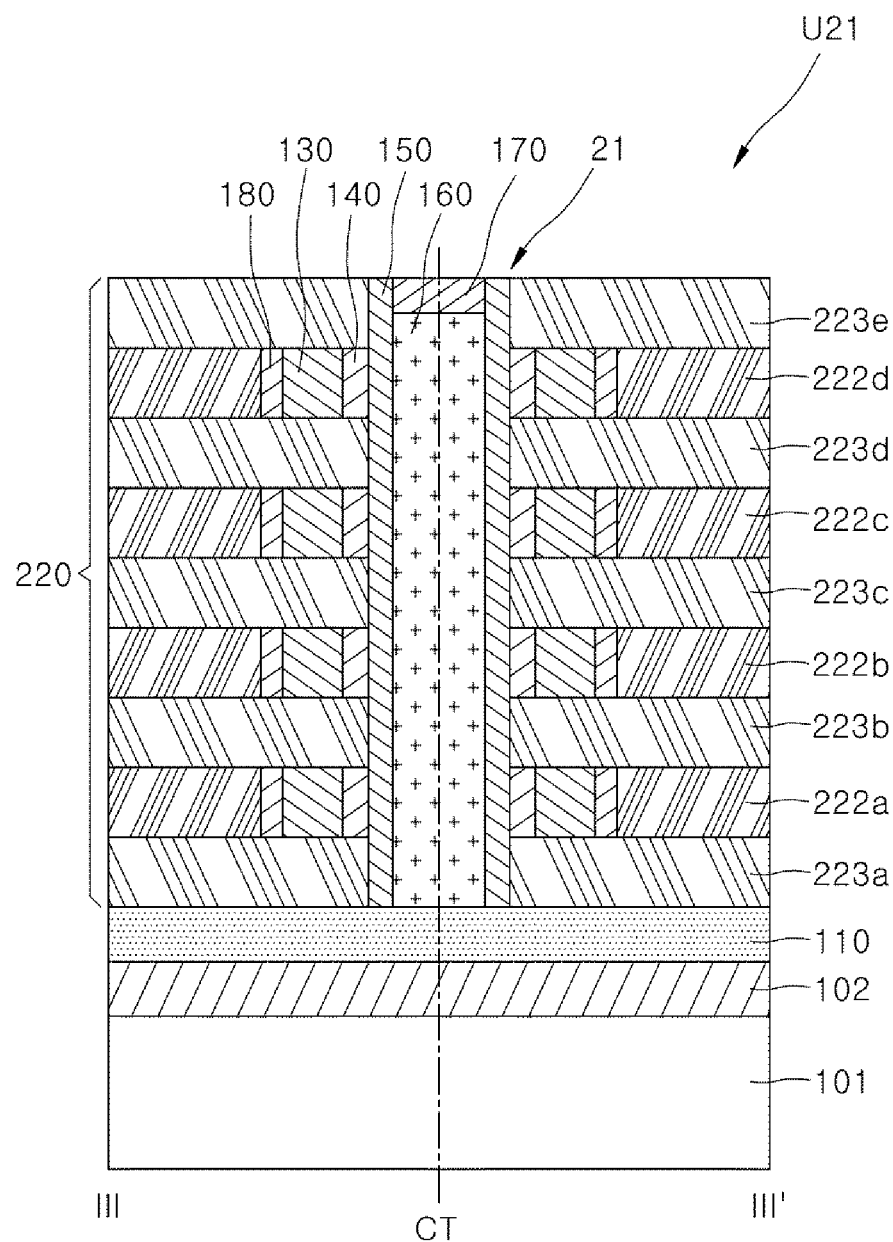
FIG. 11 is a cross-sectional view taken along a line III-III' of the semiconductor device of FIG. 9.

FIG. 9 is a perspective view schematically illustrating a semiconductor device 2 according to yet another embodiment of the present disclosure. FIG. 10 is a plan view of the semiconductor device of FIG. 9. FIG. 11 is a cross-sectional view taken along a line III-III of the semiconductor device of FIG. 9.

Referring to FIGS. 9 to 11, the semiconductor device 2 may be different from the semiconductor device 1A of FIGS. 6 to 8 in the configuration of a gate structure 220. The configuration of the semiconductor device 2 except for the gate structure 220 may be substantially the same as that of the semiconductor device 1A described above.

The gate structure 220 may be disposed on a channel lower contact layer 110. The gate structure 220 may include first to fourth gate electrode layers 222a, 222b, 222c, and 222d and first to fifth interlayer insulation layers 223a, 223b, 223c, 223d, and 223e which are alternately stacked along a first direction (i.e., the z-direction) perpendicular to a substrate 101. The first interlayer insulation layer 223a may be disposed to contact the channel lower contact layer 110. The fifth interlayer insulation layer 223e may be disposed as an uppermost layer of the gate structure 220.

The gate structure 220 may include hole patterns 21 and 22. The gate insulation layer 180, a first variable resistance layer 130, and a second variable resistance layer 140 may be disposed to sequentially cover the sidewall surfaces of the first to fourth gate electrode layers 222a, 222b, 222c, and 222d in each of the hole patterns 21 and 22. As an example, the gate insulation layer 180, the first variable resistance layer 130, and the second variable resistance layer 140 may be sequentially disposed in concentric layers within the first and second hole patterns 21 and 22. The second variable resistance layer 140 may contact the channel layer 150 in the radial direction, which is illustrated by contact in the x-direction in FIG. 11.

Referring to FIGS. 9 to 11, the first to fifth interlayer insulation layers 223a, 223b, 223c, 223d, and 223e of the present embodiment may further extend toward the center CT of each of the hole patterns 21 and 22, compared to the first to fifth interlayer insulation layers 123a, 123b, 123c, 123d, and 123e of the semiconductor device 1A described above with reference to FIGS. 6 to 8. Specifically, the first to fifth interlayer insulation layers 223a, 223b, 223c, 223d, and 223e may be disposed to contact the channel layer 150. The center CT of each of the hole patterns 21 and 22 may refer to the center point of each of the circular hole patterns 21 and 22 in the plan view of FIG. 10, and may refer to a central axis inside the hole pattern 21, extending in a direction perpendicular to an upper or lower surface of the substrate 101 and through the semiconductor device as seen in the cross-sectional view of FIG. 11.

The first to fifth interlayer insulation layers 223a, 223b, 223c, 223d, and 223e of the present embodiment may divide the gate insulation layer 180, the first variable resistance layer 130, and the second variable resistance layer 140 in the z-direction. As a result, a region of the gate insulation layer 180, a region of the first variable resistance layer 130, and a region of the second variable resistance layer 140 that are controlled by a gate electrode layer can be separated from regions controlled by a different gate electrode layer. Thus, the first to fourth gate electrode layers 222a, 222b, 222c, and 222d, and corresponding regions of the gate insulation layer 180, the first variable resistance layer 130, and the second variable resistance layer 140 for each of the gate electrode layers may be separated from each other in the z-direction. In other words, it is possible to prevent the regions of the gate insulation layer 180, the first variable resistance layer 130, and the second variable resistance layer 140 from interference or control by neighboring gate electrode layers among the first to fourth gate electrode layers 222a, 222b, 222c, and 222d, thereby preventing redundant or double control. Accordingly, electrical interference occurring between neighboring memory cells along the z-direction can be effectively excluded with the extension of first to fifth interlayer insulation layers 223a, 223b, 223c, 223d, and 223e toward center CT.

Figure 12:
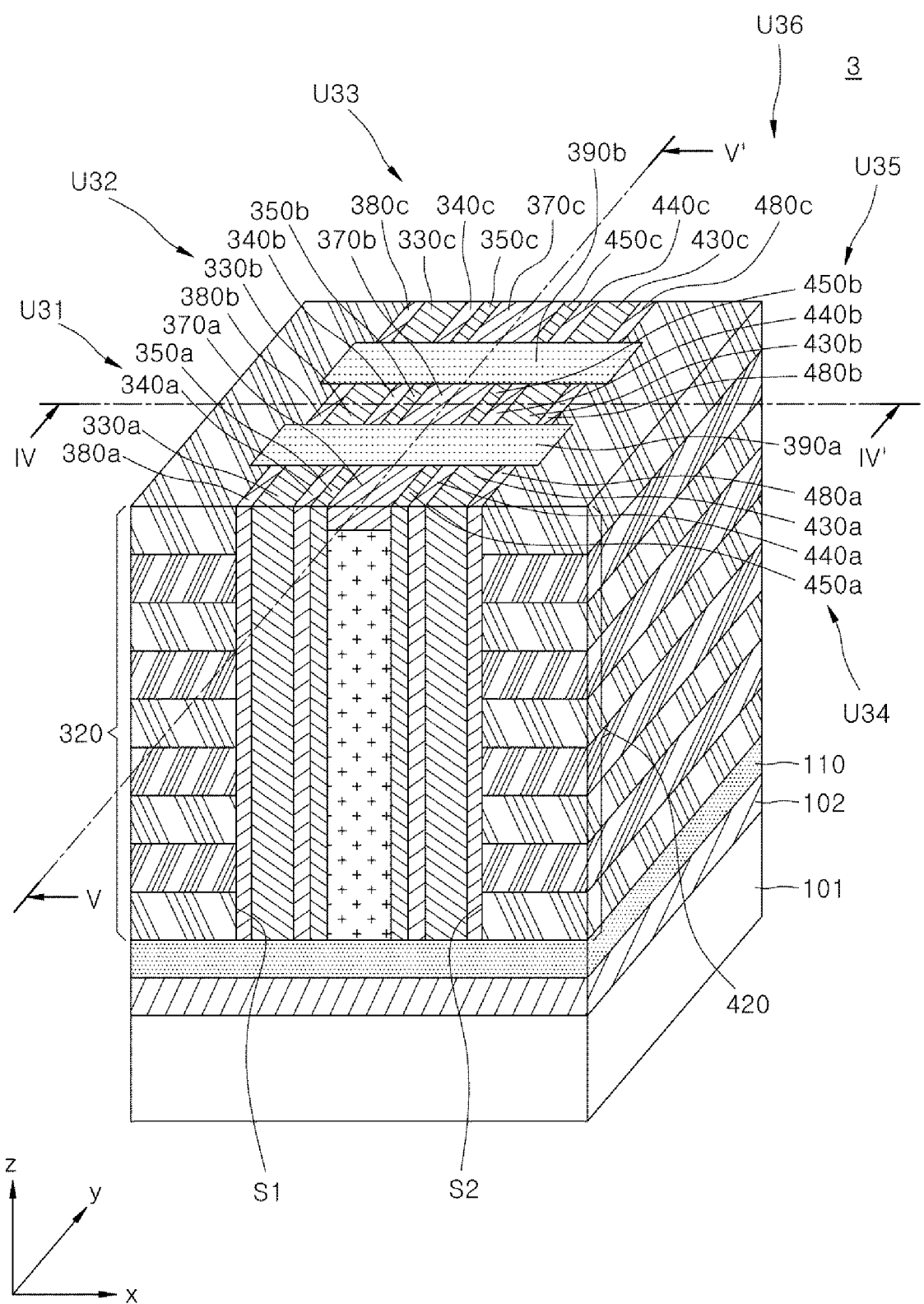
FIG. 12 is a perspective view schematically illustrating a semiconductor device according to yet another embodiment of the present disclosure.
Figure 13:
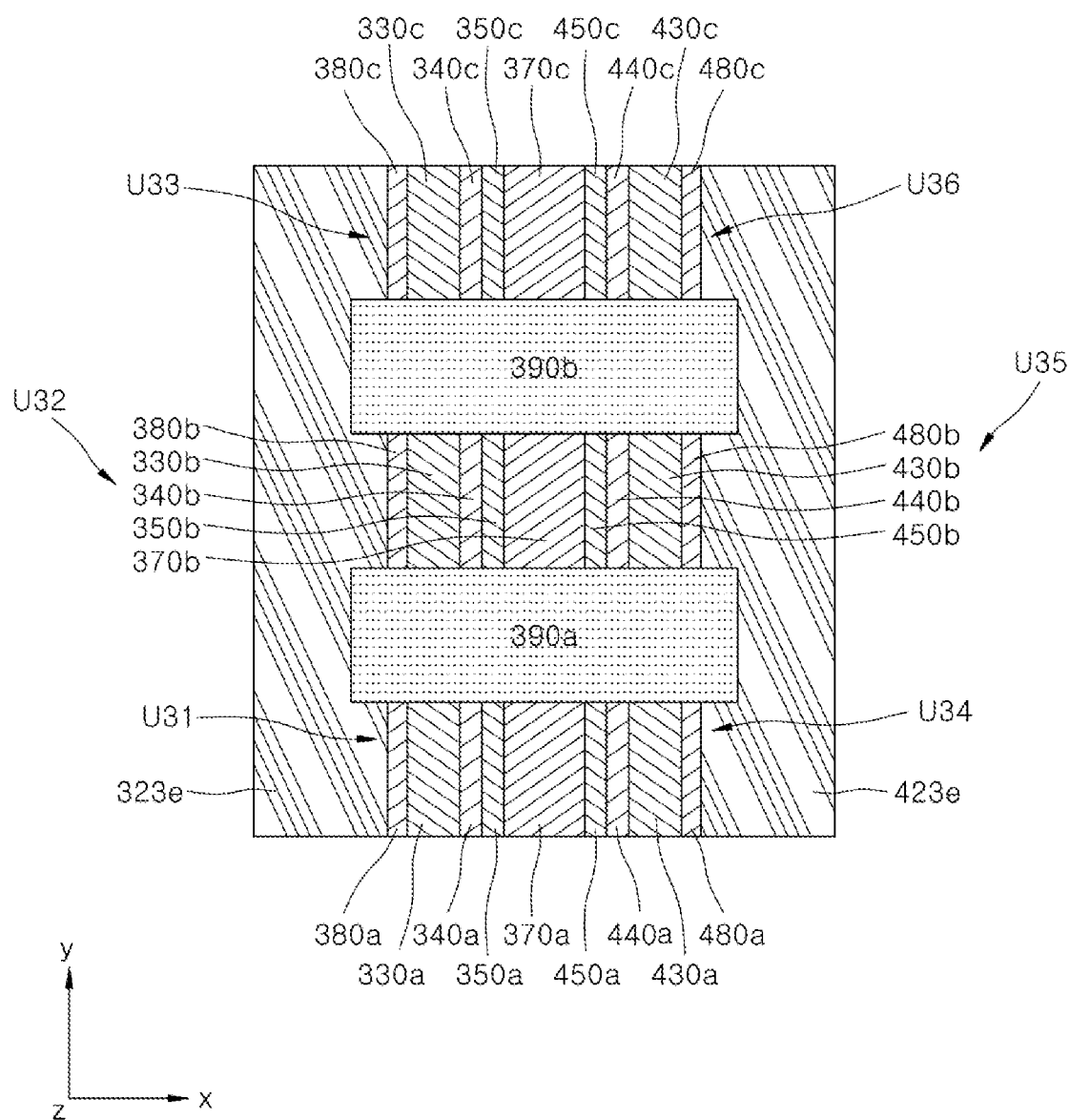
FIG. 13 is a plan view of the semiconductor device of FIG. 12.
Figure 14:
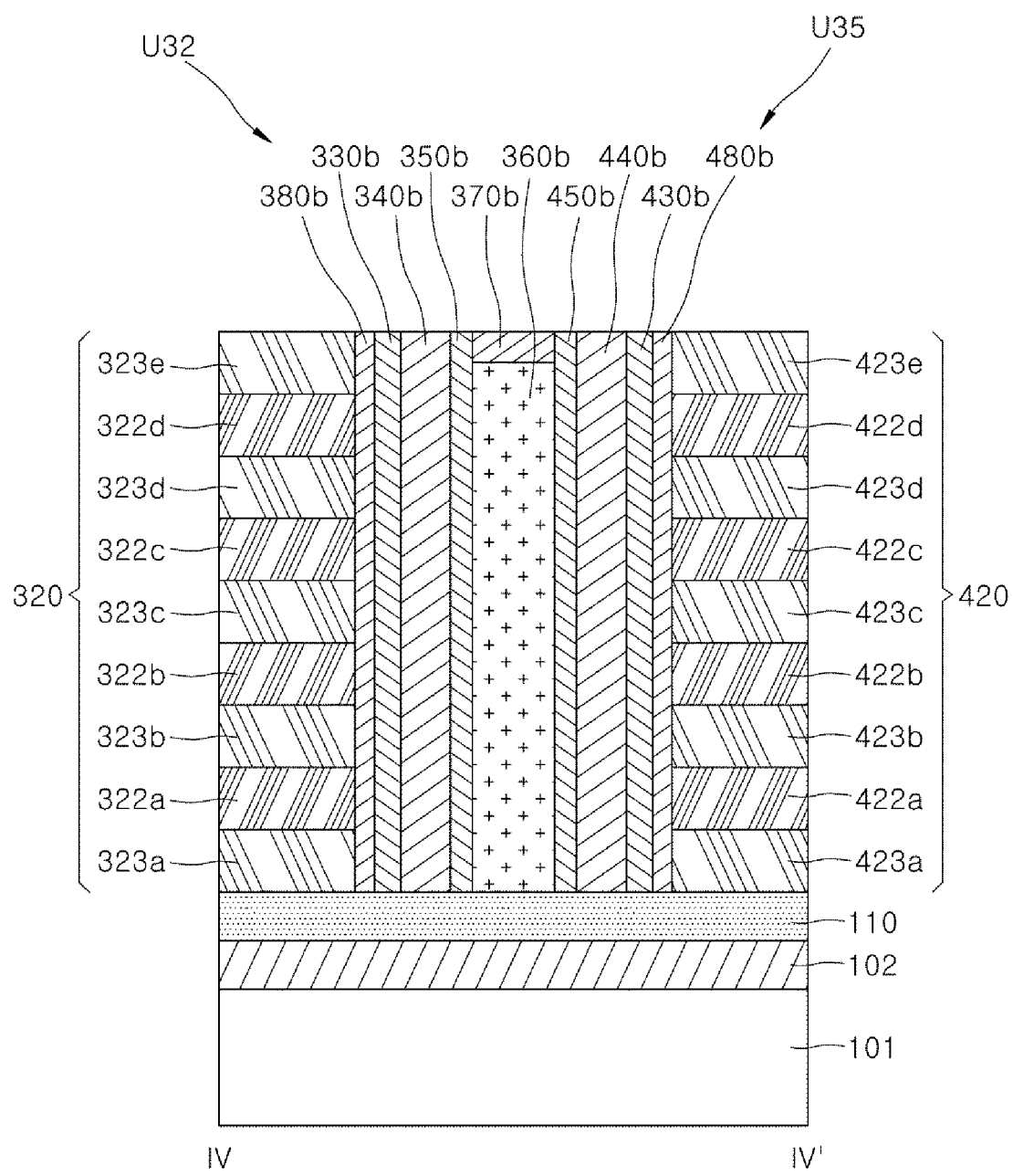
FIG. 14 is a cross-sectional view taken along a line IV-IV' of the semiconductor device of FIG. 12.
Figure 15:
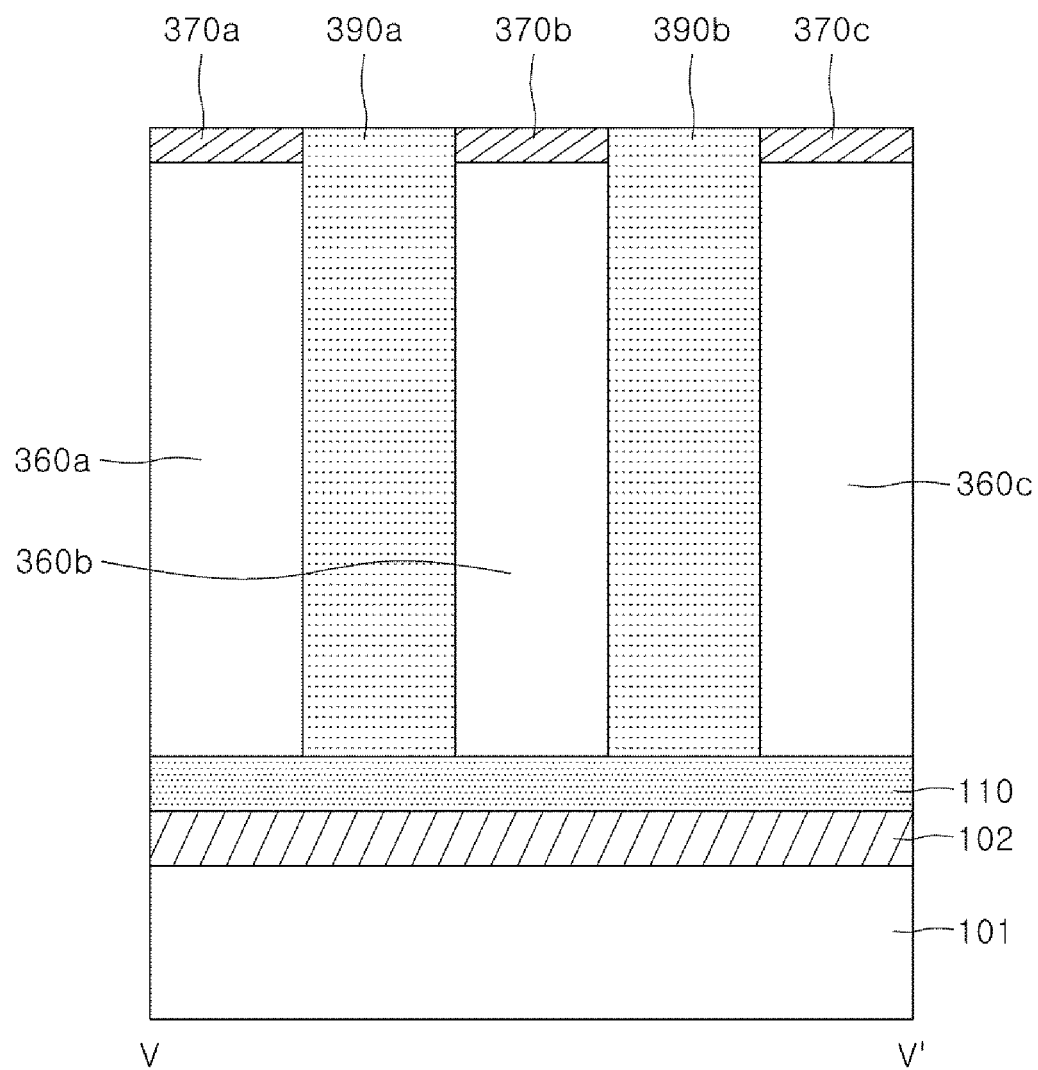
FIG. 15 is a cross-sectional view taken along a line V-V' of the semiconductor device of FIG. 12.

FIG. 12 is a perspective view schematically illustrating a semiconductor device 3 according to yet another embodiment of the present disclosure. FIG. 13 is a plan view of the semiconductor device of FIG. 12. FIG. 14 is a cross-sectional view taken along a line IV-IV' of the semiconductor device of FIG. 12. FIG. 15 is a cross-sectional view taken along a line V-V' of the semiconductor device of FIG. 12.

Referring to FIGS. 12 to 15, the semiconductor device 3 may include a substrate 101, and first and second gate structures 320 and 420 disposed on the substrate 101. The semiconductor device 3 may include gate insulation layers 380a, 380b, and 380c, first variable resistance layers 330a, 330b, and 330c, second variable resistance layers 340a, 340b, and 340c, and channel layers 350a, 350b, and 350c disposed on the substrate 101. The gate insulation layers 380a, 380b, and 380c, the first variable resistance layers 330a, 330b, and 330c, and the second variable resistance layers 340a, 340b, and 340c sequentially cover a sidewall surface S1 of the first gate structure 320.

In addition, the semiconductor device 3 may include gate insulation layers 480a, 480b, and 480c, first variable resistance layers 430a, 430b, and 430c, second variable resistance layers 440a, 440b, and 440c, and channel layers 450a, 450b, and 450c disposed on the substrate 101. The gate insulation layers 480a, 480b, and 480c, the first variable resistance layers 430a, 430b, and 430c, and the second variable resistance layers 440a, 440b, and 440c sequentially cover a sidewall surface S2 of the second gate structure 420 on the substrate 101.

Referring to FIGS. 12 to 15, the substrate 101 may be provided. A base insulation layer 102 and a channel lower contact layer 110 may be sequentially disposed on the substrate 101.

The first gate structure 320 may be disposed on the channel lower contact layer 110. The first gate structure 320 may include first to fourth gate electrode layers 322a, 322b, 322c, and 322d and first to fifth interlayer insulation layers 323a, 323b, 323c, 323d, and 323e, which are alternately stacked along a first direction (i.e., the z-direction). The first gate structure 320 may extend in a second direction (i.e., the y-direction) perpendicular to the first direction (i.e., the z-direction).

Each of the first to fourth gate electrode layers 322a, 322b, 322c, and 322d may include a conductive material. The conductive material of the first to fourth gate electrode layers 322a, 322b, 322c, and 322d may be substantially the same as the conductive material of the first to fourth gate electrode layers 122a, 122b, 122c, and 122d of the semiconductor device 1 described above with reference to FIGS. 1 to 3. Each of the first to fifth interlayer insulation layers 323a, 323b, 323c, 323d, and 323e may include an insulating material. The insulating material of the first to fifth interlayer insulation layers 323a, 323b, 323c, 323d, and 323e may be substantially the same as the insulating material of the first to fifth interlayer insulation layers 123a, 123b, 123c, 123d, and 123e of the semiconductor device 1 described above with reference to FIGS. 1 to 3.

In some embodiments, the number of the gate electrode layers of the first gate structure 320 might not necessarily be limited to four. The gate electrode layers may be arranged in various numbers, and the interlayer insulation layers may insulate the various numbers of the gate electrode layers from each other along the first direction (i.e., the z-direction).

Referring to FIGS. 12 to 15, the gate insulation layers 380a, 380b, and 380c may be disposed, on the channel lower contact layer 110, to cover a sidewall surface S1 of the first gate structure 320. The gate insulation layers 380a, 380b, and 380c may be isolated from each other with respect to the second direction (i.e., the y-direction) by first and second cell insulation structures 390a and 390b. That is, the gate insulation layers 380a, 380b, and 380c may be spaced apart from each other with respect to the second direction (i.e., the y-direction). Each of the gate insulation layers 380a, 380b, and 380c may include an insulating material. The insulating material of each of the gate insulation layers 380a, 380b, and 380c may be substantially the same as the insulating material of the gate insulation layer 180 of the semiconductor device 1A described above with reference to FIGS. 6 to 8.

The first variable resistance layers 330a, 330b, and 330c, the second variable resistance layers 340a, 340b, and 340c, and the channel layers 350a, 350b, and 350c may be disposed, on the channel lower contact layer 110, to sequentially cover the gate insulation layers 380a, 380b, and 380c. The first variable resistance layers 330a, 330b, and 330c, the second variable resistance layers 340a, 340b, and 340c, and the channel layers 350a, 350b, and 350c may be isolated from each other with respect to the second direction (i.e., the y-direction) by the first and second cell insulation structures 390a and 390b.

The second variable resistance layers 340a, 340b, and 340c may include oxygen exchangeable with corresponding first variable resistance layers 330a, 330b, and 330c. Materials constituting the first variable resistance layers 330a, 330b, and 330c and the second variable resistance layers 340a, 340b, and 340c may be substantially the same as the materials constituting the first variable resistance layer 130 and the second variable resistance layer 140 of the semiconductor device 1 described above with reference to FIGS. 1 to 3.

Each of the channel layers 350a, 350b, and 350c may include a semiconductor material. The semiconductor material of the channel layers 350a, 350b, and 350c may be substantially the same as the semiconductor material of the channel layer 150 of the semiconductor device 1 described above with reference to FIGS. 1 to 3.

Meanwhile, the second gate structure 420 may be disposed, on the channel lower contact layer 110, to be spaced apart from the first gate structure 320 in a third direction (i.e., the x-direction). The second gate structure 420 may include first to fourth gate electrode layers 422a, 422b, 422c, and 422d and first to fifth interlayer insulation layers 423a, 423b, 423c, 423d, and 423e, which are alternately stacked along the first direction (i.e., the z-direction). The configurations of the first to fourth gate electrode layers 422a, 422b, 422c, and 422d and first to fifth interlayer insulation layers 423a, 423b, 423c, 423d, and 423e may be substantially the same as the configurations of the first to fourth gate electrode layers 322a, 322b, 322c, and 322d and first to fifth interlayer insulation layers 323a, 323b, 323c, 323d, and 323e of the first gate structure 320.

Referring to FIGS. 12 to 15, the gate insulation layers 480a, 480b, and 480c may be disposed, on the channel lower contact layer 110, to cover a sidewall surface S2 of the second gate structure 420. The gate insulation layers 480a, 480b, and 480c may be isolated from each other with respect to the second direction (i.e., the y-direction) by first and second cell insulation structures 390a and 390b. That is, the gate insulation layers 480a, 480b, and 480c may be disposed to be spaced apart from each other with respect to the second direction (i.e., the y-direction). Each of the gate insulation layers 480a, 480b, and 480c may include an insulating material. The insulating material of the gate insulation layers 480a, 480b, and 480c may be substantially the same as the insulating material of the gate insulation layer 180 of the semiconductor device 1 described above with reference to FIGS. 6 to 8.

The first variable resistance layers 430a, 430b, and 430c, the second variable resistance layers 440a, 440b, and 440c, and the channel layers 450a, 450b, and 450c may be disposed, on the channel lower contact layer 110, to sequentially cover the respective gate insulation layers 480a, 480b, and 480c. The first variable resistance layers 430a, 430b, and 430c, the second variable resistance layers 440a, 440b, and 440c, and the channel layers 450a, 450b, and 450c may be isolated from each other with respect to the second direction (i.e., the y-direction) by the first and second cell insulation structures 390a and 390b.

The first variable resistance layers 430a, 430b, and 430c may include oxygen exchangeable with second variable resistance layers 440a, 440b, and 440c. Materials constituting the first variable resistance layers 430a, 430b, and 430c and the second variable resistance layers 440a, 440b, and 440c may be substantially the same as the materials constituting the first variable resistance layer 130 and the second variable resistance layer 140 of the semiconductor device 1 described above with reference to FIGS. 1 to 3.

Each of the channel layers 450a, 450b, and 450c may include a semiconductor material. The semiconductor material of the channel layers 450a, 450b, and 450c may be substantially the same as the semiconductor material of the channel layer 150 of the semiconductor device 1 described above with reference to FIGS. 1 to 3.

Filling structures 360a, 360b, and 360c may be respectively disposed, on the channel lower contact layer 110, between the channel layers 350a, 350b, and 350c of the first gate structure 320 and the channel layers 450a, 450b, and 450c of the second gate structure 420. Each of the filling structures 360a, 360b, and 360c may include an insulating material. The insulating material may include, for example, oxide, nitride, oxynitride, or a combination of two or more thereof.

The channel upper contact layers 370a, 370b, and 370c may be disposed on the filling structures 360a, 360b, and 360c. The channel upper contact layers 370a, 370b, and 370c may be separated from each other by the cell insulation structures 390a and 390b. The channel upper contact layers 370a, 370b, and 370c may be respectively disposed to contact the corresponding channel layers 350a, 350b, and 350c of the first gate structure 320 and the channel layers 450a, 450b, and 450c of the second gate structure 420.

The cell insulation structures 390a and 390b may be disposed, on the channel lower contact layer 110, to extend in the first direction (i.e., the z-direction). The cell insulation structures 390a and 390b may be disposed to contact the first and second gate structures 320 and 420 in a third direction (i.e., the x-direction). The cell insulation structures 390a and 390b may be spaced apart from each other in the second direction (i.e., the y-direction). Each of the cell insulation structures 390a and 390b may include an insulating material. The insulating material may include, for example, oxide, nitride, oxynitride, or a combination of two or more thereof.

Referring to FIGS. 12 and 13 again, the semiconductor device 3 may include first to sixth memory element units U31, U32, U33, U34, U35, and U36, which perform operations independently of each other. The first memory element unit U31 may include the first gate structure 320, the first gate insulation layer 380a, the first variable resistance layer 330a, the second variable resistance layer 340a, the channel layer 350a, and the channel upper contact layer 370a. In the same way, as illustrated in FIG. 12, each of the second to sixth memory element units U32, U33, U34, U35, and U36 may include a gate structure, and a corresponding gate insulation layer, first variable resistance layer, second variable resistance layer, channel layer, and channel upper contact layer. The first to sixth memory element units U31, U32, U33, U34, U35, and U36 may share the channel lower contact layer 110.

The circuit diagram of any one of the first to sixth memory element units U31, U32, U33, U34, U35, and U36 may be substantially the same as the circuit diagram of FIG. 4. Operation methods of the first to sixth memory element units U31, U32, U33, U34, U35, and U36 may be substantially the same as the operation method of the semiconductor device 1 described above in connection with FIGS. 5A to 5H. That is, the write operation and the read operation of any one of the first to sixth memory element units U31, U32, U33, U34, U35, and U36 may be substantially the same as the write operation and the read operation of the semiconductor device 1 described above in connection with FIGS. 5A to 5H.

Figure 16:
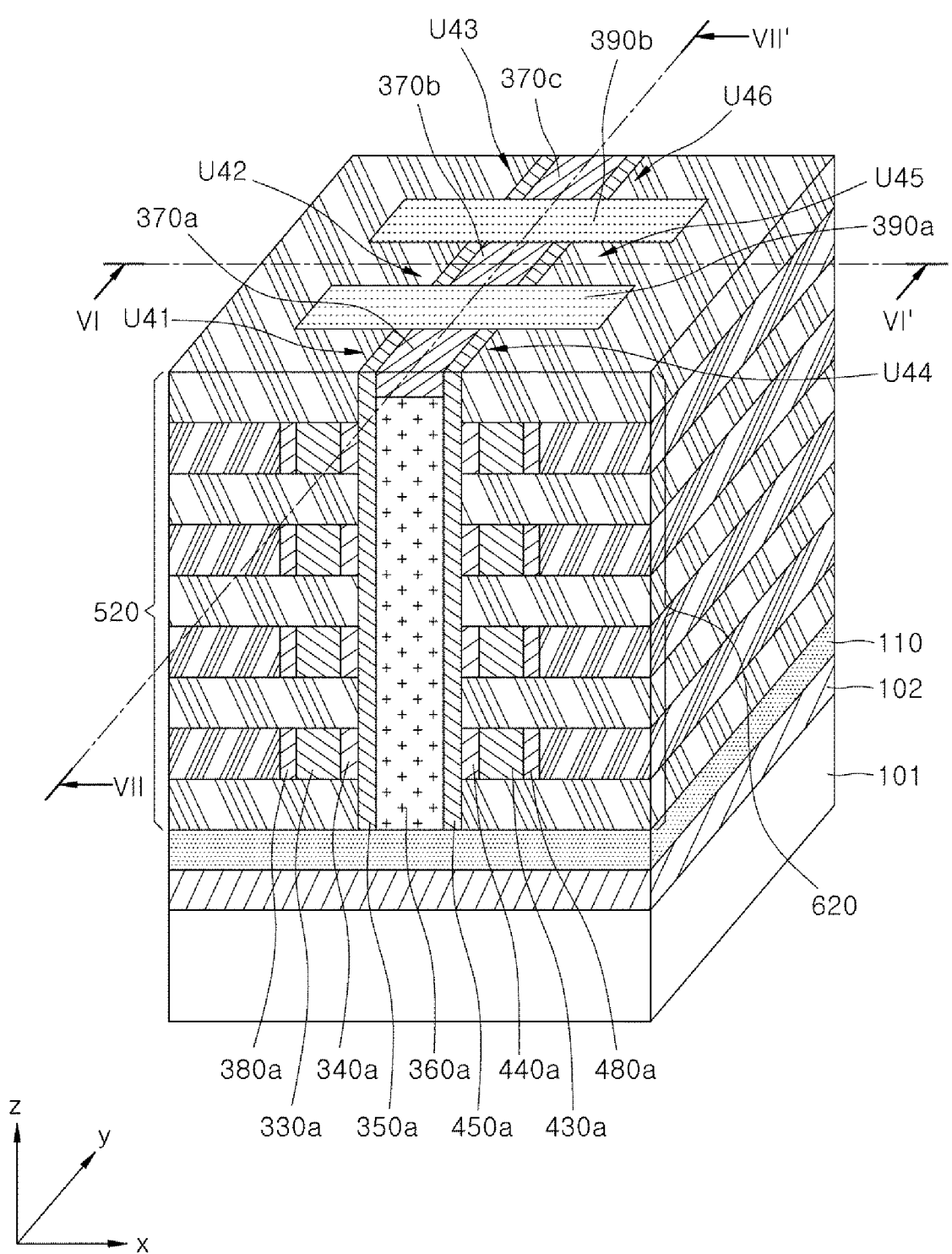
FIG. 16 is a perspective view schematically illustrating a semiconductor device according to yet another embodiment of the present disclosure.
Figure 17:
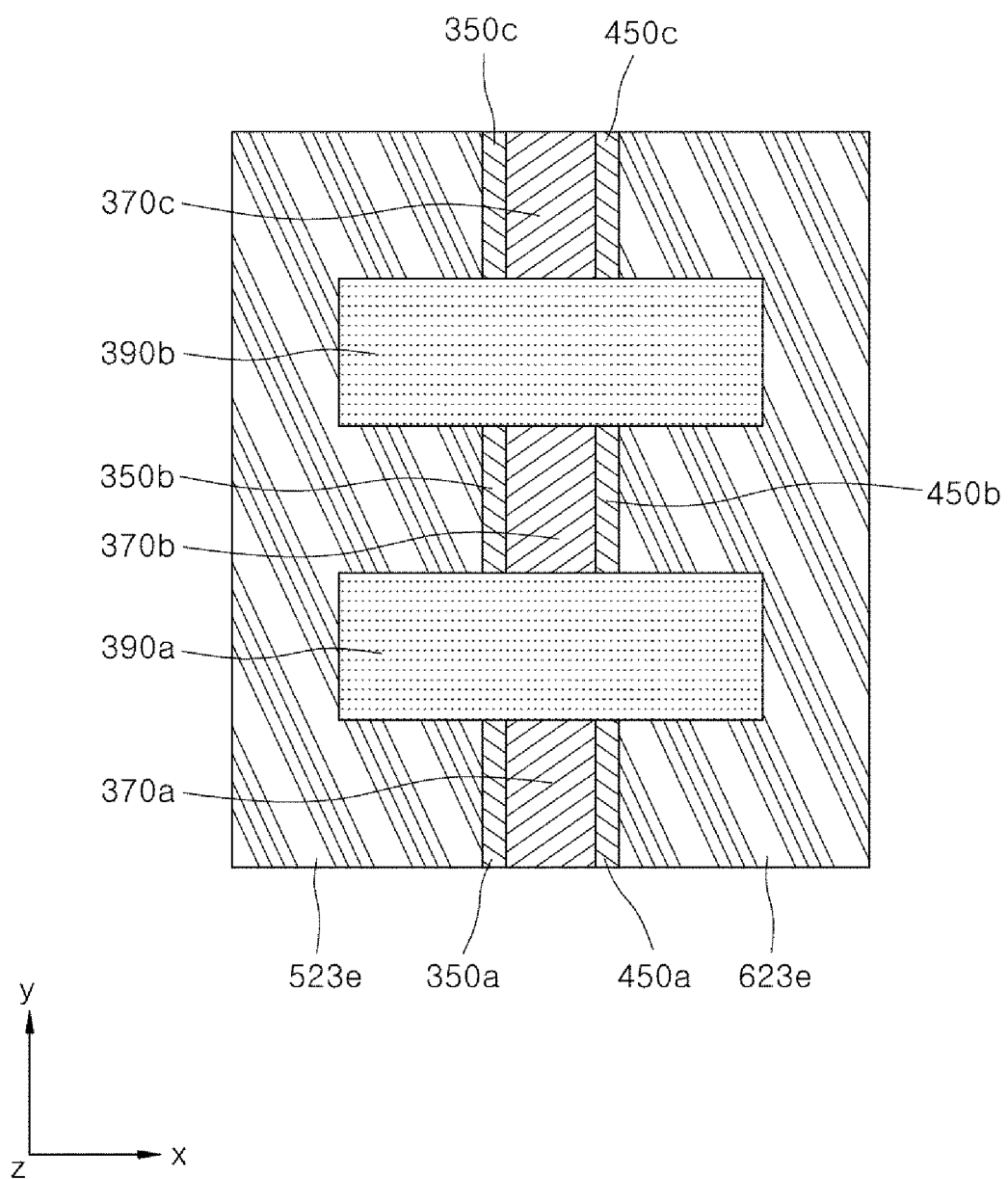
FIG. 17 is a plan view of the semiconductor device of FIG. 16.
Figure 18:
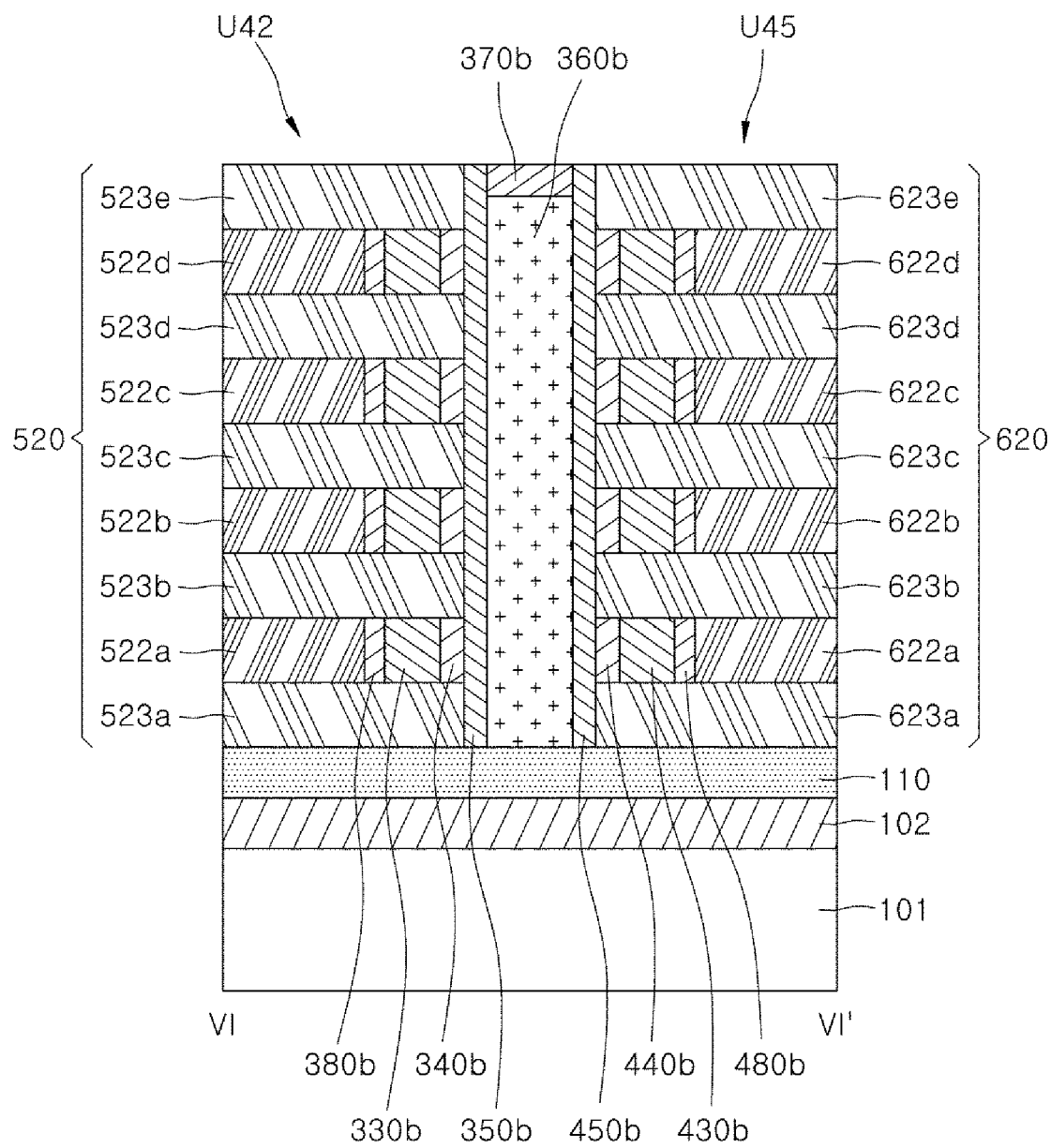
FIG. 18 is a cross-sectional view taken along a line VI-VI' of the semiconductor device of FIG. 16.
Figure 19:
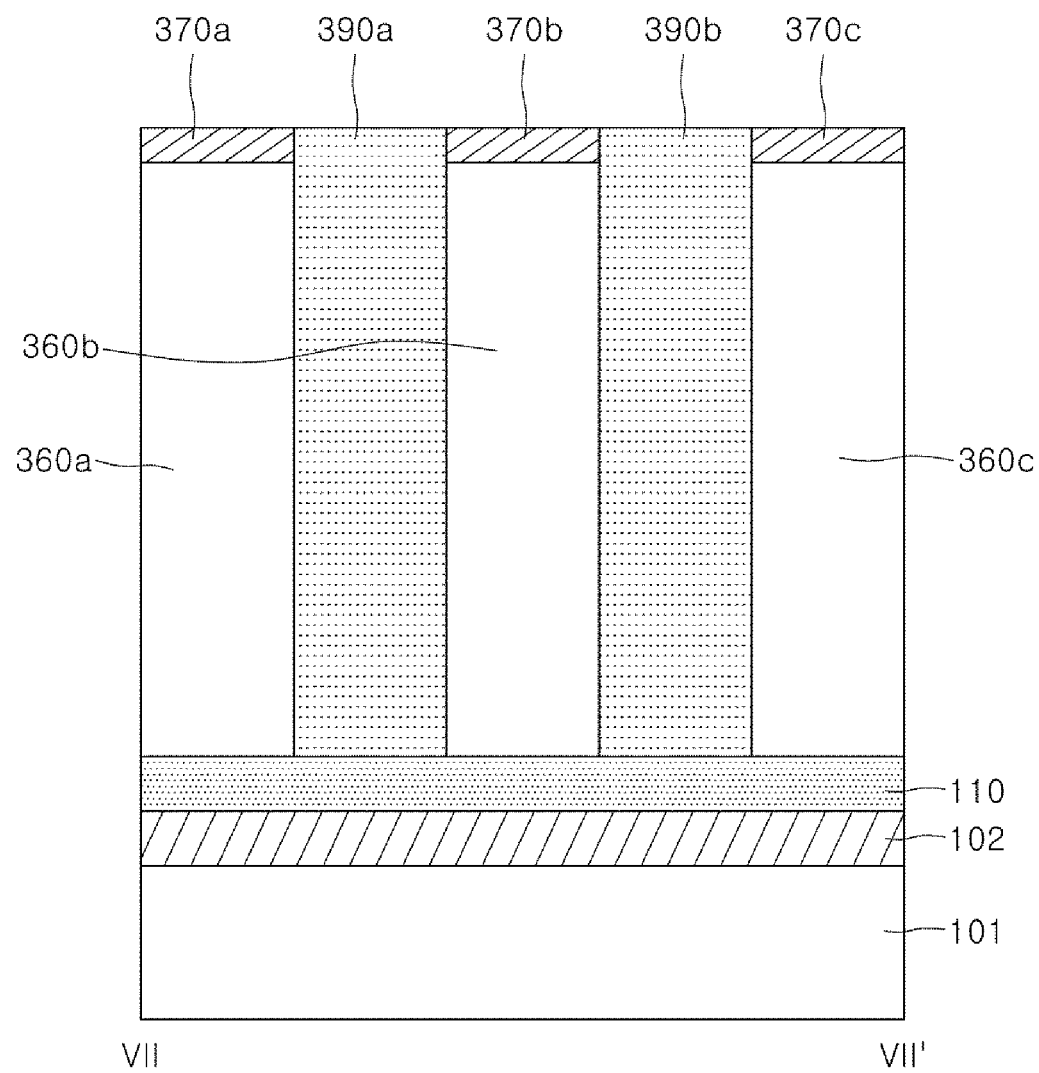
FIG. 19 is a cross-sectional view taken along a line AI-AI' of the semiconductor device of FIG. 16.

FIG. 16 is a perspective view schematically illustrating a semiconductor device 4 according to yet another embodiment of the present disclosure. FIG. 17 is a plan view of the semiconductor device of FIG. 16. FIG. 18 is a cross-sectional view taken along a line VI-VI' of the semiconductor device of FIG. 16. FIG. 19 is a cross-sectional view taken along a line VII-VII' of the semiconductor device of FIG. 16.

Referring to FIGS. 16 to 19, the semiconductor device 4 may be different from the semiconductor device 3 described above with reference to FIGS. 12 to 15 in configurations of first and second gate structures 520 and 620. The rest of the configuration of the semiconductor device 4, except for the first and second gate structures 520 and 620, may be substantially the same as that of the semiconductor device 3.

The first gate structure 520 may include first to fourth gate electrode layers 522a, 522b, 522c, and 522d and first to fifth interlayer insulation layers 523a, 523b, 523c, 523d, and 523e, which are alternately stacked along a first direction (i.e., the z-direction) on a channel lower contact layer 110. The first interlayer insulation layer 523a may be disposed to contact the channel lower contact layer 110. The fifth interlayer insulation layer 523e may be disposed as the uppermost layer of the first gate structure 520. Similarly, the second gate structure 620 may include first to fourth gate electrode layers 622a, 622b, 622c, and 622d and first to fifth interlayer insulation layers 623a, 623b, 623c, 623d, and 623e, which are alternately stacked along a first direction (i.e., the z-direction) on a channel lower contact layer 110. The first interlayer insulation layer 623a may be disposed to contact the channel lower contact layer 110. The fifth interlayer insulation layer 623e may be disposed as the uppermost layer of the second gate structure 620.

Referring to FIGS. 16 to 19, the first to fifth interlayer insulation layers 523a, 523b, 523c, 523d, and 523e of the first gate structure 520 may further extend toward a third direction (i.e., the x-direction), compared to the first to fifth interlayer insulation layers 323a, 323b, 323c, 323d, and 323e of the first gate structure 320 described above with reference to FIGS. 12 to 15. Specifically, the first to fifth interlayer insulation layers 523a, 523b, 523c, 523d, and 523e of the first gate structure 520 may be disposed to contact channel layers 350a, 350b, and 350c. Similarly, in the present embodiment, the first to fifth interlayer insulation layers 623a, 623b, 623c, 623d, and 623e of the second gate structure 620 may further extend toward the third direction (i.e., the x-direction), compared to the first to fifth interlayer insulating layers 423a, 423b, 423c, 423d, and 423e of the second gate structure 420 described above with reference to FIGS. 12 to 15. Specifically, the first to fifth interlayer insulation layers 623a, 623b, 623c, 623d, and 623e may be disposed to contact the channel layers 450a, 450b, and 450c.

The first to fifth interlayer insulation layers 523a, 523b, 523c, 523d, and 523e of the first gate structure 520 may separate the gate insulation layers 380a, 380b, and 380c, the first variable resistance layers 330a, 330b, and 330c, and the second variable resistance layers 340a, 340b, and 340c from each other in the z-direction. For example, as compared with the semiconductor device 3 described above with reference to FIGS. 12 to 15, the gate insulation layers, the first variable resistance layers, and the second variable resistance layers are divided into segments or portions that are spaced apart in the z-direction. As a result, the regions of the gate insulation layers 380a, 380b, and 380c, the regions of the first variable resistance layers 330a, 330b, and 330c, and the regions of the second variable resistance layers 340a, 340b, and 340c, which are electrically controlled by the first to fourth gate electrode layers 522a, 522b, 522c, and 522d, can be separated from each other in the z-direction by the interlayer insulating layers. In other words, it is possible to prevent the regions of the gate insulation layers 380a, 380b, and 380c, the regions of the first variable resistance layers 330a, 330b, and 330c, and the regions of the second variable resistance layers 340a, 340b, and 340c from interference or control by the neighboring gate electrode layers among the first to fourth gate electrode layers 522a, 522b, 522c, and 522d, thereby preventing redundant or double control. Accordingly, electrical interference occurring between neighboring memory cells along the z-direction can be effectively reduced or prevented by extending the first to fifth interlayer insulation layers 523a, 523b, 523c, 523d, and 523e.

Likewise, the first to fifth interlayer insulation layers 623a, 623b, 623c, 623d, and 623e of the second gate structure 620 extend in the x-direction to contact channel layers 350a, 350b, and 350c. Gate insulation layers 480a, 480b, and 480c, the first variable resistance layers 430a, 430b, and 430c, and the second variable resistance layers 440a, 440b, and 440c may be separated or partitioned in the z-direction. As a result, the regions of the gate insulation layers 480a, 480b, and 480c, the regions of the first variable resistance layers 430a, 430b, and 430c, and the regions of the second variable resistance layers 440a, 440b, and 440c that are electrically controlled by the first to fourth gate electrode layers 622a, 622b, 622c, and 622d, respectively, can be separated from each other in the z-direction by the interlayer insulating layers. In other words, it is possible to prevent the regions of the gate insulation layers 480*a*, 480*b*, and 480*c*, the regions of the first variable resistance layers 430*a*, 430*b*, and 430*c*, and the regions of the second variable resistance layers 440*a*, 440*b*, and 440*c* from interference or control by the adjacent gate electrode layers among the first to fourth gate electrode layers 622*a*, 622*b*, 622*c*, and 622*d*, thereby preventing redundant or double control. Accordingly, electrical interference occurring between neighboring memory cells along the z-direction can be effectively reduced or prevented by extending the first to fifth interlayer insulation layers 623*a*, 623*b*, 623*c*, 623*d*, and 623*e*.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
    a substrate;
    a gate structure disposed on the substrate, the gate structure comprising at least one gate electrode layer and at least one interlayer insulation layer that are alternately stacked;
    a hole pattern penetrating the gate structure on substrate; and
    a first variable resistance layer, a second variable resistance layer, and a channel layer sequentially disposed on a sidewall surface of the gate electrode layer in the hole pattern,
    wherein the first and second variable resistance layers comprise ions exchangeable with each other.

2. The semiconductor device of claim 1, wherein the second variable resistance layer has a variable oxygen vacancy concentration, based on an oxygen exchange with the first variable resistance layer.

3. The semiconductor device of claim 2, wherein the second variable resistance layer stores in a non-volatile manner a plurality of different electrical resistances according to the variable oxygen vacancy concentration.

4. The semiconductor device of claim 2, wherein the variable oxygen vacancy concentration of the second variable resistance layer varies by an electric field applied between the at least one gate electrode layer and the channel layer.

5. The semiconductor device of claim 1, further comprising:
    a channel lower contact layer contacting a first end of the channel layer on the substrate; and
    a channel upper contact layer contacting a second end of the channel layer opposite to the first end,
    wherein the channel lower contact layer and the channel upper contact layer are electrically connected to a source electrode and a drain electrode, respectively.

6. The semiconductor device of claim 1, wherein each of the first and second variable resistance layers comprises an oxygen-deficient oxide, and
    wherein the oxygen-deficient oxide comprises silicon oxide or metal oxide.

7. The semiconductor device of claim 6, wherein an oxygen affinity of an element of the first variable resistance layer is greater than an oxygen affinity of an element of the second variable resistance layer.

8. The semiconductor device of claim 1, wherein when a program voltage is applied to the at least one gate electrode layer, the first variable resistance layer functions as an oxygen receiving layer, and the second variable resistance layer functions as an oxygen supply layer, and
    wherein when an erase voltage is applied to the at least one gate electrode layer, the first variable resistance layer functions as an oxygen supply layer, and the second variable resistance layer functions as an oxygen receiving layer.

9. The semiconductor device of claim 1, wherein the first and second variable resistance layers comprise metal exchangeable with each other, and
    wherein when a program voltage is applied to the at least one gate electrode layer, the first variable resistance layer functions as a metal supply layer, and the second variable resistance layer functions as a metal receiving layer, and
    when an erase voltage is applied to the at least one gate electrode layer, the first variable resistance layer functions as a metal receiving layer, and the second variable resistance layer functions as a metal supply layer.

10. The semiconductor device of claim 9, wherein when the program voltage is applied, metal moving from the first variable resistance layer to the second variable resistance layer has a greater mobility than oxygen moving from the second variable resistance layer to the first variable resistance layer.

11. The semiconductor device of claim 1, wherein a thickness of the second variable resistance layer is less than a thickness of the first variable resistance layer.

12. The semiconductor device of claim 11, wherein a thickness of the second variable resistance layer is 1 nm or more, but less than 5 nm.

13. The semiconductor device of claim 1, further comprising a gate insulation layer disposed between a sidewall surface of the gate structure and the first variable resistance layer.

14. A semiconductor device comprising:
    a substrate;
    a gate structure disposed on the substrate, the gate structure comprising at least one gate electrode layer and at least one interlayer insulation layer that are alternately stacked along a first direction perpendicular to an upper surface of the substrate, wherein the gate structure extends in a second direction perpendicular to the first direction; and
    a first variable resistance layer, a second variable resistance layer, and a channel layer that are sequentially disposed on a sidewall surface of the gate structure on the substrate,
    wherein the first and second variable resistance layers comprise oxygen exchangeable with each other.

15. The semiconductor device of claim 14, wherein the second variable resistance layer has a variable oxygen vacancy concentration, based on oxygen exchange with the first variable resistance layer.

16. The semiconductor device of claim 15, wherein the second variable resistance layer stores in a nonvolatile manner a plurality of different electrical resistances according to the variable oxygen vacancy concentration.

17. The semiconductor device of claim 14, further comprising:
    a channel lower contact layer, disposed between the gate structure and the substrate, contacting a first end of the channel layer on the substrate; and
    a channel upper contact layer contacting a second end of the channel layer opposite to the first end, wherein the channel lower contact layer and the channel upper contact layer are electrically connected to a source electrode and a drain electrode, respectively.

18. The semiconductor device of claim 17, further comprising a plurality of cell insulation structures disposed on the substrate and spaced apart from each other in the second direction, wherein the plurality of cell insulation structures extend in the first direction on the substrate, and extend in a third direction perpendicular to the first and second directions and separate the first variable resistance layer, the second variable resistance layer and the channel layer with respect to the second direction.

19. The semiconductor device of claim 14, wherein the at least one interlayer insulation layer extends in a third direction perpendicular to the first and second directions and is disposed to contact the channel layer.

20. The semiconductor device of claim 14, further comprising a gate insulation layer disposed between on the substrate a sidewall surface of the gate structure and the first variable resistance layer.

* * * * *